(12) United States Patent
Kawasaki et al.

(10) Patent No.: US 11,830,703 B2
(45) Date of Patent: Nov. 28, 2023

(54) ION IMPLANTATION METHOD AND ION IMPLANTER

(71) Applicant: SUMITOMO HEAVY INDUSTRIES ION TECHNOLOGY CO., LTD., Tokyo (JP)

(72) Inventors: Yoji Kawasaki, Ehime (JP); Haruka Sasaki, Ehime (JP)

(73) Assignee: SUMITOMO HEAVY INDUSTRIES ION TECHNOLOGY CO, LTD., Tokyo (JP)

( * ) Notice: Subject to any disclaimer, the term of this patent is extended or adjusted under 35 U.S.C. 154(b) by 0 days.

(21) Appl. No.: 16/512,059

(22) Filed: Jul. 15, 2019

(65) Prior Publication Data
US 2020/0027697 A1    Jan. 23, 2020

(30) Foreign Application Priority Data
Jul. 18, 2018    (JP) .................................. 2018-135346

(51) Int. Cl.
| | | |
|---|---|---|
| *H01J 37/317* | (2006.01) | |
| *H01L 21/04* | (2006.01) | |
| *H01L 21/324* | (2006.01) | |
| *H01L 21/265* | (2006.01) | |
| *H01L 21/66* | (2006.01) | |

(52) U.S. Cl.
CPC ........ *H01J 37/3171* (2013.01); *H01L 21/047* (2013.01); *H01L 21/26586* (2013.01); *H01L 21/324* (2013.01); *H01L 22/14* (2013.01)

(58) Field of Classification Search
None
See application file for complete search history.

(56) References Cited

U.S. PATENT DOCUMENTS

| | | | | |
|---|---|---|---|---|
| 4,934,644 | A | * | 6/1990 | Nagy ..................... H02G 3/105 |
| | | | | 24/339 |
| 5,753,923 | A | * | 5/1998 | Mera ................... H01J 37/3171 |
| | | | | 250/442.11 |
| 6,242,747 | B1 | * | 6/2001 | Sugitani ................... H05H 9/00 |
| | | | | 250/251 |
| 7,884,000 | B2 | | 2/2011 | Aoki et al. |
| 9,287,148 | B1 | * | 3/2016 | Evans ................ H01L 21/6776 |
| 10,096,677 | B2 | * | 10/2018 | Jelinek ............. H01L 29/66712 |
| 11,072,543 | B2 | * | 7/2021 | Benzerrouk ............ C02F 1/325 |
| 2003/0011029 | A1 | | 1/2003 | Matsuda |
| 2003/0108130 | A1 | * | 6/2003 | Tucker .................... F16L 3/133 |
| | | | | 375/345 |
| 2004/0192005 | A1 | | 9/2004 | Shindo |

(Continued)

FOREIGN PATENT DOCUMENTS

| | | | |
|---|---|---|---|
| CN | 208175932 U | * | 12/2018 |
| JP | H01-072523 A | | 3/1989 |

(Continued)

*Primary Examiner* — Andrew Smyth
(74) *Attorney, Agent, or Firm* — Michael Best & Friedrich LLP

(57) ABSTRACT

An ion implantation method includes irradiating a wafer having a first temperature with a first ion beam such that a predetermined channeling condition is satisfied and irradiating the wafer having a second temperature different from the first temperature with a second ion beam such that the predetermined channeling condition is satisfied, after the irradiation of the first ion beam.

23 Claims, 17 Drawing Sheets

(56) References Cited

U.S. PATENT DOCUMENTS

| | | | |
|---|---|---|---|
| 2006/0113493 A1* | 6/2006 | Kabasawa | H01J 37/1478 250/492.21 |
| 2012/0190171 A1* | 7/2012 | Yamazaki | H01L 21/76254 438/455 |
| 2014/0065737 A1* | 3/2014 | Ninomiya | H01L 22/14 118/712 |
| 2014/0234554 A1* | 8/2014 | Radovanov | C23C 16/045 427/569 |
| 2015/0028350 A1* | 1/2015 | Suvorov | H01L 21/047 257/77 |
| 2015/0228515 A1* | 8/2015 | Lee | H01L 21/67109 165/61 |
| 2016/0027646 A1* | 1/2016 | Wu | H01L 21/6831 438/530 |
| 2016/0163546 A1* | 6/2016 | Godet | H01L 21/0332 257/623 |
| 2017/0110322 A1 | 4/2017 | Laven et al. | |
| 2017/0170020 A1* | 6/2017 | Kawasaki | H01L 22/14 |
| 2017/0271161 A1* | 9/2017 | Kawasaki | H01J 37/3171 |
| 2017/0352544 A1* | 12/2017 | Farley | H01L 21/26513 |
| 2018/0197761 A1* | 7/2018 | Ferrara | C23C 14/48 |
| 2018/0240672 A1* | 8/2018 | Laven | H01L 29/0834 |
| 2018/0301337 A1* | 10/2018 | Nishiyama | H01L 21/046 |
| 2018/0370231 A1* | 12/2018 | Sato | B41J 2/1433 |
| 2019/0051554 A1* | 2/2019 | Song | H01L 21/68742 |
| 2019/0304783 A1* | 10/2019 | Prasad | H01L 21/0332 |
| 2020/0247689 A1* | 8/2020 | McNulty | C02F 1/76 |
| 2020/0392019 A1* | 12/2020 | Benzerrouk | C02F 1/325 |

FOREIGN PATENT DOCUMENTS

| | | | |
|---|---|---|---|
| JP | 02278819 A | * | 11/1990 |
| JP | H02-278819 A | | 11/1990 |
| JP | H03-110834 A | | 5/1991 |
| JP | H04-160157 A | | 6/1992 |
| JP | H10-214843 A | | 8/1998 |
| JP | 2003-031798 A | | 1/2003 |
| JP | 2004-311960 A | | 11/2004 |
| JP | 2007-281120 A | | 10/2007 |
| JP | 2010-129839 A | | 6/2010 |
| JP | 2016-530712 A | | 9/2016 |
| JP | 2017-107751 A | | 6/2017 |
| JP | 2017-174850 A | | 9/2017 |

* cited by examiner

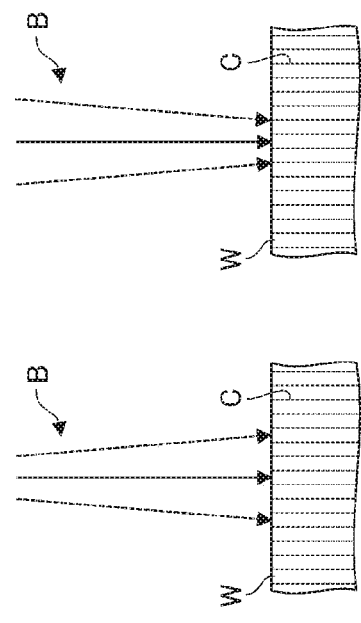
FIG. 2A
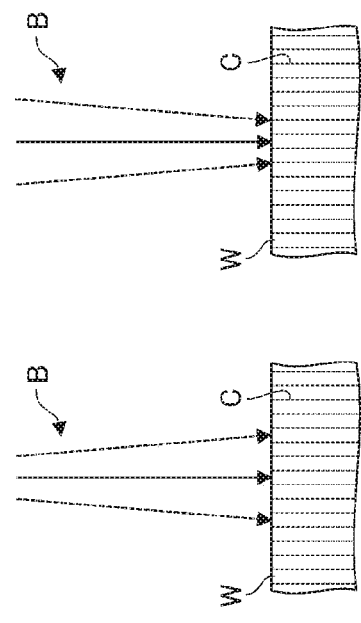
FIG. 2B
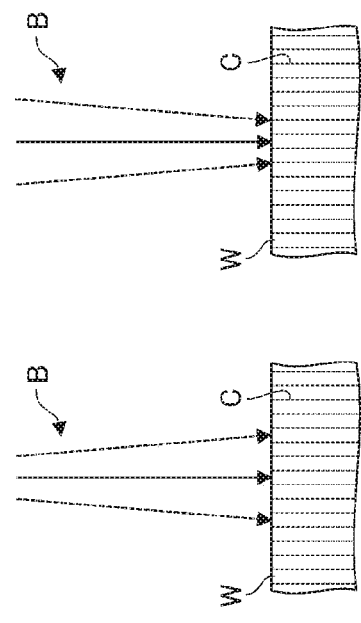
FIG. 2C
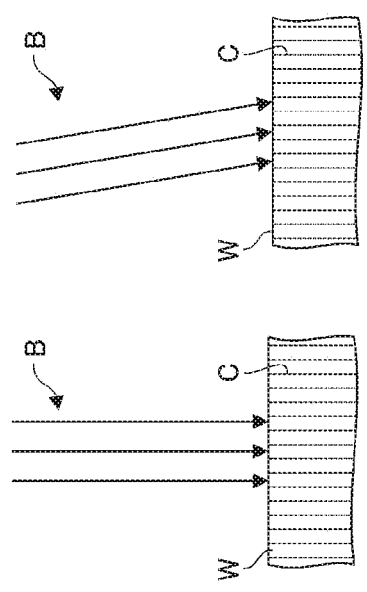
FIG. 2D
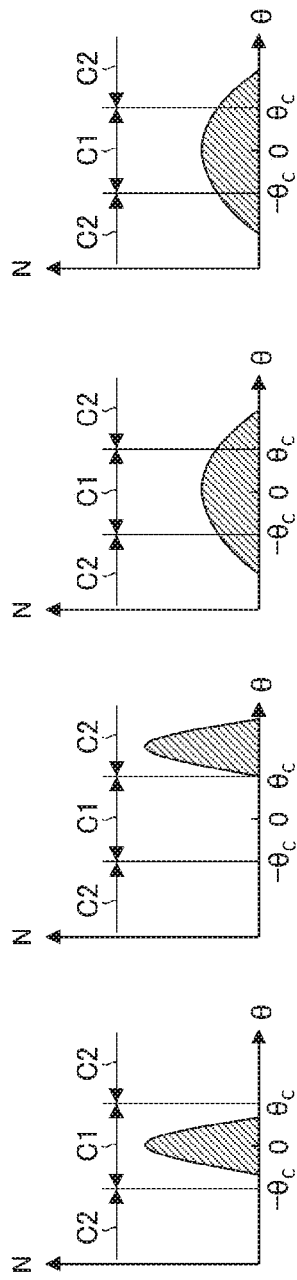
FIG. 2E
FIG. 2F
FIG. 2G
FIG. 2H

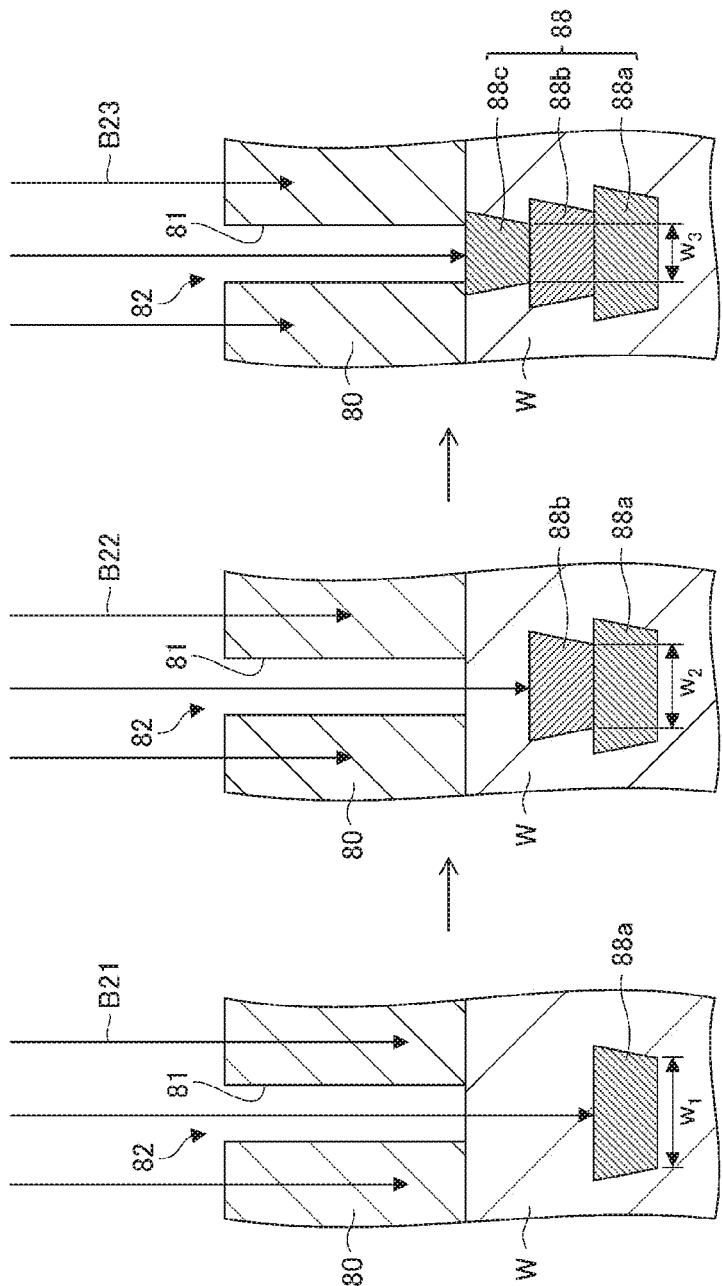

φ = 23°
θ = 0°

φ = 0°
θ = 15°

φ = 23°
θ = 7°

ION IMPLANTATION METHOD AND ION IMPLANTER

RELATED APPLICATIONS

Priority is claimed to Japanese Patent Application No. 2018-135346, filed Jul. 18, 2018, the entire content of which is incorporated herein by reference.

BACKGROUND

Technical Field

Certain embodiment of the present invention relates to an ion implantation method and an ion implanter.

Description of Related Art

In a semiconductor manufacturing process, in order to change conductivity of a semiconductor and/or change a crystal structure of a semiconductor, a process of implanting ions into a semiconductor wafer (referred to as an ion implantation process) is generally performed. The ion implantation process may be performed via a mask formed on a wafer surface, and in this case, ions are selectively implanted at a location corresponding an opening region of the mask. Moreover, ions may be selectively implanted using an element structure such as a gate electrode formed on the wafer surface, and in this case, ions are implanted into a source/drain region or other device structure part adjacent to the gate electrode.

In addition, it is known that an aspect of an interaction between an ion beam and the wafer is changed according to an implantation angle of the ion beam with which the wafer is irradiated, which influences a processing result of ion implantation. Accordingly, it is required to accurately control the implantation angle of the ion beam in order to obtain a desired implantation profile. For example, by controlling the implantation angle of the ion beam such that a predetermined channeling condition is satisfied, it is possible that the ions reach a deeper position and a deeper implantation profile can be realized. Meanwhile, by controlling the implantation angle of the ion beam such that the channeling condition is not satisfied, an implantation profile having a distribution which spreads in a horizontal direction at a shallower position can be realized.

SUMMARY

According to an embodiment of the present invention, there is provided an ion implantation method including: irradiating a wafer having a first temperature with a first ion beam such that a predetermined channeling condition is satisfied; and irradiating the wafer having a second temperature different from the first temperature with a second ion beam such that the predetermined channeling condition is satisfied, after the irradiation of the first ion beam.

According to another embodiment of the present invention, there is provided an ion implantation method including: heating or cooling a wafer to a predetermined temperature using a temperature adjustment device; irradiating the wafer having the predetermined temperature with an ion beam such that a predetermined channeling condition is satisfied; forming, compared to an implantation profile formed in the wafer when the wafer is irradiated with an ion beam such that the predetermined channeling condition is satisfied at a temperature different from the predetermined temperature, a different implantation profile in the wafer in at least one of a depth direction and an in-plane direction perpendicular to the depth direction.

According to still another embodiment of the present invention, there is provided an ion implanter. The ion implanter includes a beamline device configured to transport an ion beam; a wafer holding device configured to hold a wafer to be irradiated with the ion beam; and a temperature adjustment device configured to heat or cool the wafer. The wafer is heated or cooled to a predetermined temperature using the temperature adjustment device, the wafer is held by the wafer holding device such that a predetermined channeling condition is satisfied, and the wafer having the predetermined temperature which is held by the wafer holding device is irradiated with the ion beam.

BRIEF DESCRIPTION OF THE DRAWINGS

FIGS. 2A and 2D are diagrams schematically showing angular characteristics of ion beams incident into a wafer and FIGS. 2E to 2H are graphs schematically showing angular components of the ion beams corresponding to FIGS. 2A to 2D.

FIGS. 12A to 12C are cross sections schematically showing another example of the multiple implantations according to the embodiment.

DETAILED DESCRIPTION

Figure 1A:
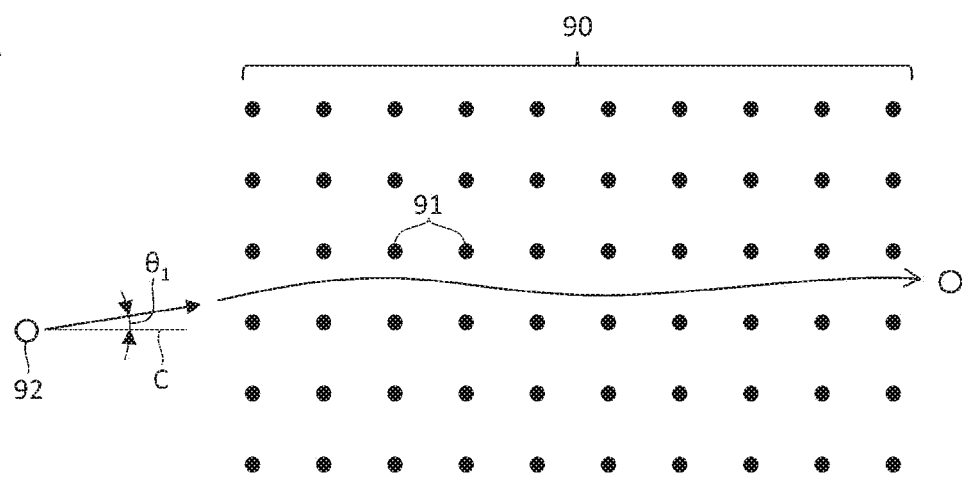
FIGS. 1A and 1B are diagrams schematically showing presence or absence of a channeling phenomenon of an implanted ion.

In a case where ions are implanted into a specific location of a wafer surface using a mask or other masking component, an implantation profile may be changed according to an incident angle of an ion beam with respect to a wafer surface, regardless of presence or absence of channeling. For example, if the beam is perpendicularly incident into the wafer surface, the ions are implanted around a positioned immediately below an opening region of the mask. However, if the beam is obliquely incident into the wafer surface, the ions are implanted around a position obliquely offset from the opening region of the mask. Therefore, even if the implantation angle of the ion beam is strictly controlled, a desired implantation profile cannot always be formed at a desired position.

It is desirable to provide an ion implantation technology capable of realizing a desired implantation profile.

Aspects of the present invention include any combination of the above-described elements and mutual substitution of elements or expressions of the present invention among apparatuses, methods, systems, or the like.

According to the present invention, it is possible to provide an ion implantation technology capable of realizing a desired implantation profile.

Hereinafter, an embodiment of the present invention will be described in detail with reference to the drawings. In description of the drawings, the same reference numerals are assigned to the same elements, and repeated descriptions will be omitted appropriately. Configurations described below are illustrative and do not limit the scope of the present invention.

Before the embodiment is described, an overview of the present invention will be described. In the ion implantation method according to the present embodiment, a wafer is heated or cooled to the predetermined temperature using a temperature adjustment device, and the wafer having a predetermined temperature is irradiated with an ion beam such that a predetermined channeling condition is satisfied. Here, the expression that "a predetermined channeling condition is satisfied" means that implantation process is performed such that an angular condition of the ion implantation is satisfied, which can cause a channeling phenomenon by getting the ion beam to be incident along a crystal axis or a crystal plane of the wafer. According to the present embodiment, it is possible to form a desired implantation profile in the wafer by appropriately controlling both the angular condition of the ion implantation and a temperature condition of the wafer during the ion implantation.

Figure 1B:
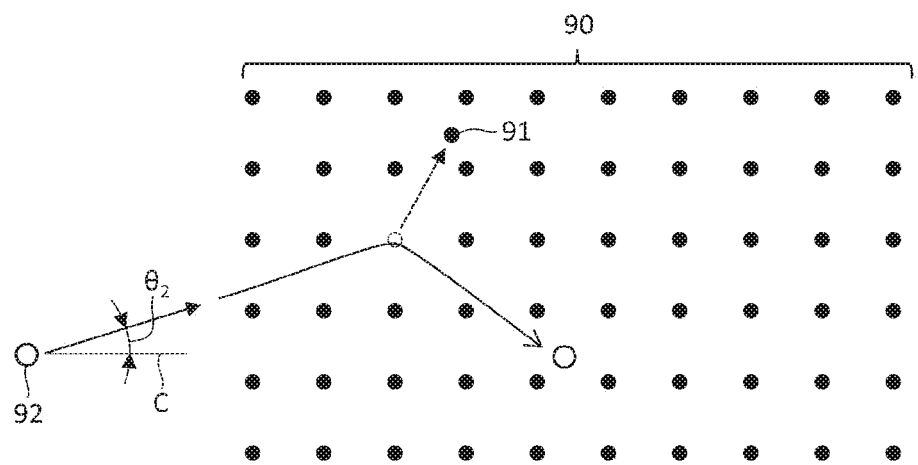

FIGS. 1A and 1B are diagrams schematically showing presence or absence of a channeling phenomenon undergone by an implanted ion 92. FIG. 1A shows an aspect in which the implanted ion 92 goes through an inside of a crystal lattice 90. An incident angle $\theta_1$ of the implanted ion 92 with respect to a crystal axis C of the crystal lattice 90 is relatively small, and the implanted ion 92 travels inside of the crystal lattice 90 along the crystal axis C. Therefore, an influence of interaction between the implanted ion 92 and atoms 91 constituting the crystal lattice 90 is small, and the implanted ion 92 can reach linearly to a deeper position of the crystal lattice 90.

FIG. 1B shows an aspect in which the implanted ion 92 does not go through the inside of the crystal lattice 90. An incident angle $\theta_2$ of the implanted ion 92 with respect to the crystal axis C of the crystal lattice 90 is relatively large, and the implanted ion 92 travels inside of the crystal lattice 90 so as to intersect the crystal axis C, interacts with the atoms 91 constituting the crystal lattice 90, and is scattered while traveling. Accordingly, the implanted ion 92 reaches only a shallower position of the crystal lattice 90, and can reach a position shifted from an initial implantation position in a direction perpendicular to an implantation direction (an upward-downward direction of a paper surface of FIG. 1B or a direction perpendicular to the paper surface of FIG. 1B).

In the present specification, a situation shown in FIG. 1A is referred to as an "on-channeling", and a situation shown in FIG. 1B is referred to as an "off-channeling". Whether the implanted ion 92 incident into the crystal lattice 90 is in the "on-channeling" or in the "off-channeling" is mainly determined by the incident angles $\theta$ of the implanted ion 92. An incident angle which becomes a threshold between the on-channeling and the off-channeling may be referred to as a critical angle $\theta_c$. For example, the critical angle $\theta_c$ can be expressed by the following Expression (1)

$$\theta_C = \sqrt{\frac{Z_1 Z_2 e^2}{2\pi\varepsilon_0 E_1 d}} \quad (1)$$

Here, $Z_1$ is an atomic number of the implanted ion, $Z_2$ is an atomic number of a material which is an implantation target, $E_1$ is energy of the implanted ion, and d is an atomic interval in a crystal of the material which is the implantation target. For example, in a case where the implanted ion is boron (B), the implantation target is silicon (Si), and the atomic interval d corresponding to a (100) plane of a silicon crystal is used, the critical angle $\theta_c$ is approximately 3.5° if the implantation energy $E_1$=100 keV, and the critical angle $\theta_c$ is approximately 1.1° if the implantation energy $E_1$=1 MeV. In addition, in a case where the implanted ion is phosphorus (P) and the other conditions are the same as those described above, the critical angle $\theta$ is approximately 6.0° if implantation energy $E_1$=100 keV, and the critical angle $\theta$ is approximately 1.9° if implantation energy $E_1$=1 MeV.

If the incident angle $\theta$ of the implanted ion is sufficiently small in comparison with the critical angles $\theta_c$ having the above-described values ($\theta<\theta_c$), the ion is implanted in the situation of the on-channeling shown in FIG. 1A. Meanwhile, if the incident angle $\theta$ of the implanted ion is sufficiently large in comparison with the critical angles $\theta$ having the above-described values ($\theta>\theta_c$), the ion is implanted in the situation of the off-channeling shown in FIG. 1B. Accordingly, in a case where the wafer is irradiated with the ion beam and the implantation process is performed on the wafer, depending on the angular characteristic of the ion beam, a reaching depth, a spread in a horizontal direction of the implanted ions constituting the ion beam, or the like can be changed, and a shape of the "implantation profile" which is a concentration distribution of the implanted ions in the wafer can be changed. Accordingly, in the ion implantation process, an inclination angle of the wafer with respect to a traveling direction of the ion beam is adjusted, and an implantation angle which is an average value of entire beam incident into the wafer is controlled.

The angular characteristic of the ion beam incident into the wafer includes an angular distribution which is as an ion group constituting the ion beam, in addition to the incident angle which is the average value of entire beam. In most cases, the ion beam incident into the wafer is more or less divergent or convergent, and the ion group constituting the beam has the angular distribution with a certain spread. Even in a case where the incident angle which is the average value of entire beam is larger than the critical angle $\theta_c$, if angular components of some ions are smaller than the critical angle $\theta_c$, the channeling phenomenon is take place for the some ions. Conversely, even in a case where the incident angle which is the average value of entire beam is smaller than the critical angle $\theta_c$, if angular components of some ions are larger than the critical angle $\theta_c$, the some ions shows the off-channeling.

FIGS. 2A to 2D are diagrams schematically showing an angular characteristic of an ion beam B incident into a wafer W. In the FIGS. 2A to 2D, in order to simplify the explanation, a case where the orientation of the crystal axis C is perpendicular to a surface of the wafer W and an "off angle" of a wafer main surface is 0° is shown. The off angle of the wafer W which is actually used is not necessary to be 0° exactly.

FIG. 2A shows a "parallel beam" in which the ion beam B is incident into the wafer W to be parallel to the crystal axis C of the wafer W and almost all of the ions constituting the ion beam B travel to be parallel to the crystal axis C. FIG. 2B is similar to FIG. 2A in that the ion beam B is the parallel beam, but shows an "oblique incident beam" in which the incident angle of the ion beam B is oblique to the crystal axis C. FIG. 2C shows a "divergent beam" in which a beam diameter of the ion beam B increases toward the wafer W so that the ion beam diverges, and FIG. 2D shows a "convergent beam" in which the beam diameter of the ion beam B decreases toward the wafer W so that the ion beam converges. Accordingly, the ion beam B may diverge or converge with respect to the traveling direction as the entire beam, and the ion beam B has an "angular distribution" indicating a variation of angular components of ions, separately from the traveling direction as the entire beam.

FIGS. 2E to 2H are graphs schematically showing the angular distributions of the ion beams B corresponding to FIGS. 2A to 2D, respectively. A vertical axis of each graph indicates the number of the ions constituting the ion beam B, and a horizontal axis of each graph indicates the incident angles $\theta$ of the ion particles constituting the ion beam B with respect to the crystal axis C. In each graph, a range in which an absolute value of the incident angle $\theta$ is smaller than the critical angle $\theta_c$ is indicated as an on-channeling region C1, and a range in which the absolute value of the incident angle $\theta$ is larger than the critical angle $\theta_c$ is indicated as an off-channeling region C2.

In FIG. 2E, a center of the angular distribution of the ion beam B is 0°, a spread of the angular distribution of the ion beam B is small, and thus, the entire angular distribution is included in the on-channeling region C1. As a result, in FIG. 2E, the implanted ions, which are in the on-channeling, are dominant. Meanwhile, in FIG. 2F, the center of the angular distribution of the ion beam B is larger than the critical angle $\theta$ while the spread of the angular distribution of the ion beam B is small, and thus, the entire angular distribution is included in the off-channeling region C2. As a result, in FIG. 2F, the implanted ions, which are in the off-channeling, are dominant. In FIGS. 2G and 2H, the spread of the angular distribution of the ion beam B is large, the center of the angular distribution of the ion beam B is 0°, and thus, the entire angular distribution extends over both the on-channeling region C1 and the off-channeling region C2. As a result, in FIGS. 2G and 2H, both the on-channeling and the off-channeling are mixed. Moreover, a mixing ratio of the on-channeling and the off-channeling is changed according to the center angle of the angular distribution and a magnitude of the spread.

Figure 3:
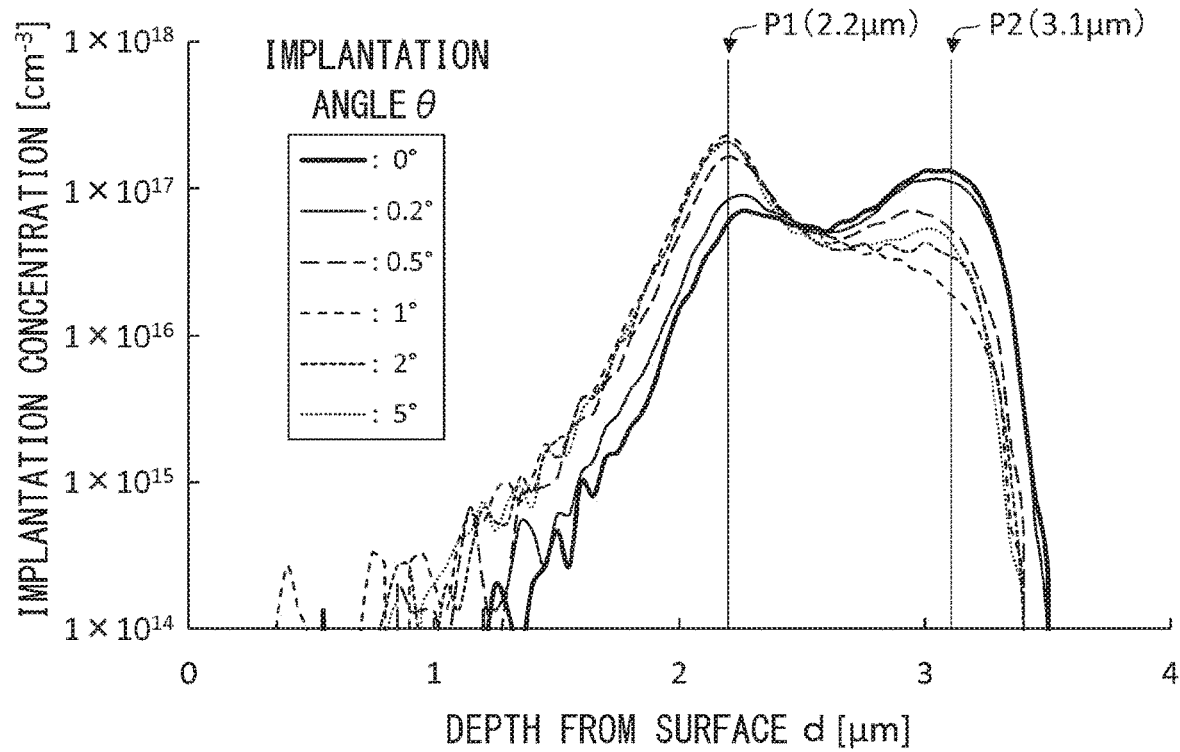
FIG. 3 is a graph showing an example of a relationship between the implantation angle of the ion beam and an implantation profile in a depth direction formed in the wafer.

FIG. 3 is a graph showing an example of a relationship between the implantation angle $\theta$ of the ion beam B and the implantation profile in a depth direction formed in the wafer. FIG. 3 shows a simulation result in a case where the implanted ion is set to be boron (B), the implantation target is set to be the (100) plane of silicon (Si), and the implantation energy is set to be 1.5 MeV. The critical angle $\theta_c$ based on the Expression 1 is approximately 0.9°. The ion beam B is the divergent beam as shown in FIG. 2C, and a magnitude of the divergent angle (standard deviation value) is about 0.4°. The implantation angle $\theta$ of the ion beam B is set to be 0°, 0.2°, 0.5°, 1°, 2°, and 5°. In general, as the implantation angle $\theta$ is smaller, the implantation profile is distributed at a deeper position (to the right of the graph). In most cases, the implantation profile has two peaks, that is, a first peak P1 positioned at a depth of approximately 2.2 μm and a second peak P2 positioned at a depth of approximately 3.1 μm. The first peak P1 tends to be lower as the implantation angle $\theta$ is smaller and to be higher as the implantation angle $\theta$ is larger, and thus, the first peak P1 is considered to correspond to the implanted ion under the off-channeling. Meanwhile, the second peak P2 tends to be higher as the implantation angle $\theta$ is smaller and to be lower as the implantation angle $\theta$ is larger, and thus, the second peak P2 is considered to correspond to the implanted ion under the on-channeling.

Figure 4:
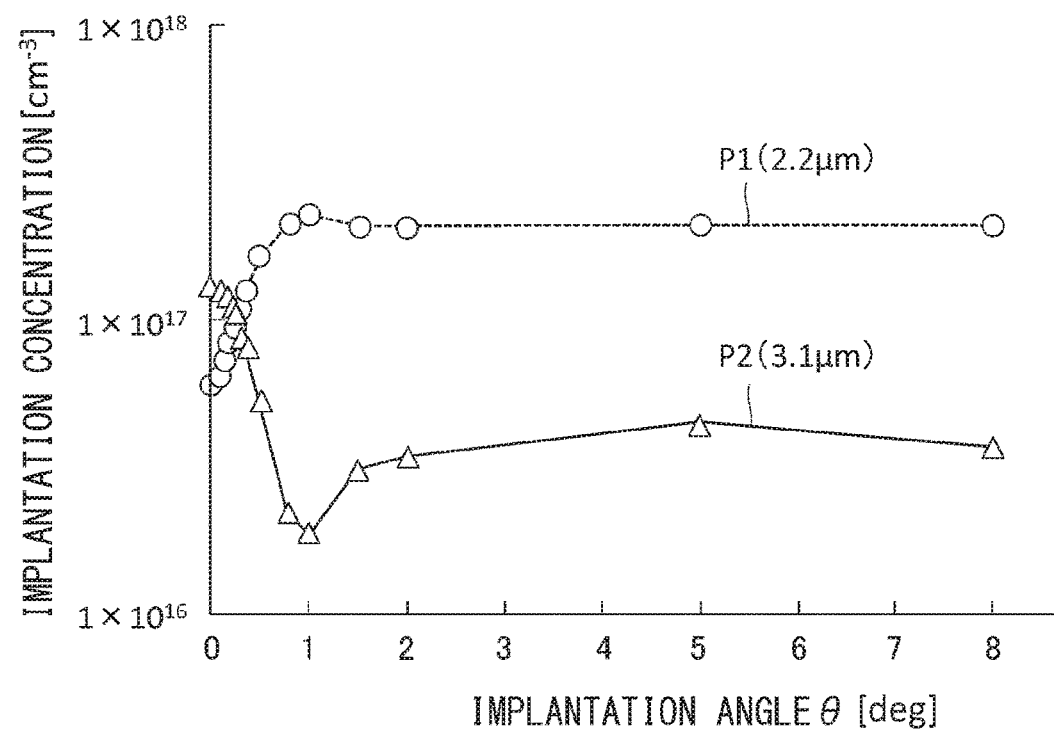
FIG. 4 is a graph showing an example of a relationship between the implantation angle of the ion beam and implantation concentrations at two peak positions.

FIG. 4 is a graph showing an example of a relationship between the implantation angle $\theta$ of the ion beam B and the implantation concentrations at the two peak positions P1 and P2, and corresponds to the implantation profile shown in FIG. 3. A broken line P1 indicates the implantation concentration at a depth d=2.2 μm corresponding to the first peak, and a solid line P2 indicates implantation concentration at a depth d=3.1 μm corresponding to the second peak. As shown in FIG. 4, the implantation concentration at the first peak P1 tends to be lower as the implantation angle $\theta$ is smaller and to be higher as the implantation angle $\theta$ is larger. Meanwhile, the implantation concentration at the second peak P2 tends to be higher as the implantation angle $\theta$ is smaller and to be lower as the implantation angle $\theta$ is larger.

Figure 5:
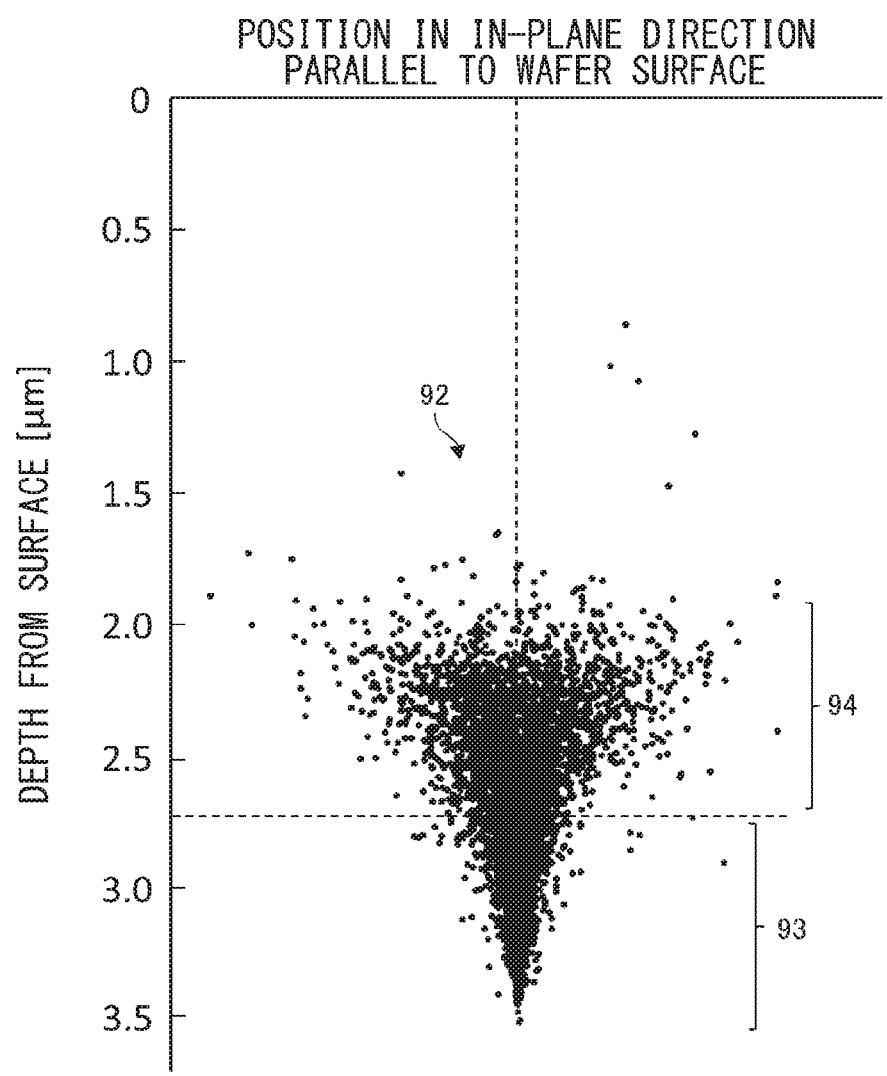
FIG. 5 is a graph schematically showing an example of a distribution of the implanted ions in the wafer.

FIG. 5 is a graph schematically showing an example of a distribution of the implanted ions 92 in the wafer. FIG. 5 shows a calculation result by a simulation under the same implantation condition as that in FIG. 3, where the implanted ion is boron (B), the implantation target is the (100) plane of silicon (Si), implantation energy is 1.5 MeV, the implantation angle $\theta$ of the ion beam B is 0°, and the magnitude of the divergent angle of the ion beam B is approximately 0.4°. A vertical axis of the graph indicates a depth position from the surface of the wafer W, and a horizontal axis of the graph indicates a position in an in-plane direction parallel to the surface of the wafer W. In the example shown in FIG. 5, the implanted ions 92 exist over a range of 2.0 μm to 3.5 μm in the depth. Ions 93 implanted at relatively deep positions are implanted ions under the on-channeling, and exist only near a center in the in-plane direction. Meanwhile, ions 94 implanted at relatively shallow positions are implanted ions under the off-channeling, and are distributed so as to spread to a position away from a central position in the in-plane direction. Accordingly, it can be seen that the implanted ions 93 and 94 under the on-channeling and the off-channeling respectively have different distributions also in the in-plane direction perpendicular to the depth direction.

As described above, the shape of the implantation profile formed in the wafer W can be controlled by accurately controlling the implantation angle θ with respect to the crystal axis C of the wafer W. In particular, if an angular condition in which the on-channeling is dominant is selected, an implantation profile having a smaller spread in-plane direction can be realized at a deeper position. Meanwhile, if an angular condition in which the off-channeling is dominant is selected, an implantation profile having a larger spread in the in-plane direction can be realized at a shallower position. In addition, it is possible to control the entire depth position of the all implanted ions by changing the energy of the implanted ion.

However, depending on a target of an ion implantation process, it may not be possible to optionally change the implantation angle θ in order to control the implantation profile. In recent years, there has been customer demand for implanting ions at a deeper position from the wafer surface in the depth direction in order to further shrink device sizes and improve characteristics thereof. In this case, in order to implant ions only in a specific region in the in-plane direction, a mask is formed on the wafer surface. Moreover, for example, high energy ion beams having an energy of 100 keV or more, or 1 MeV or more are used to implant the ions at deeper positions.

Figure 6:
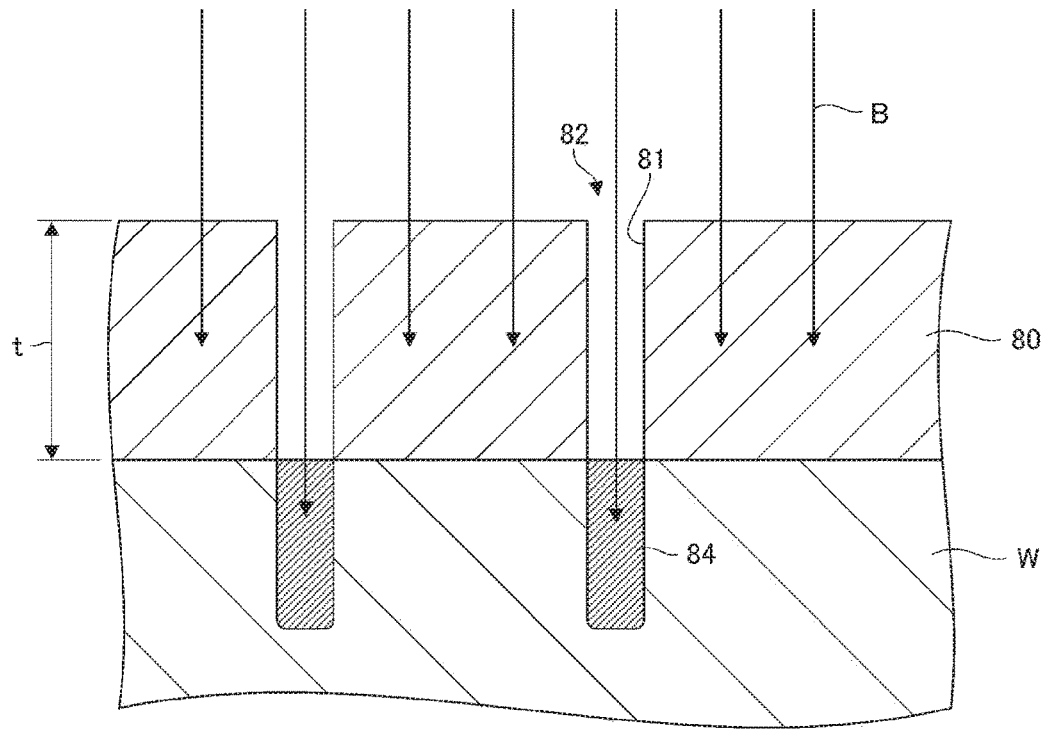
FIG. 6 is a cross section schematically showing an example of a high energy implantation process.

FIG. 6 is a cross section schematically showing an example of a high energy ion implantation process, and shows an aspect in which the wafer W is irradiated with the ion beam B through a mask 80 which is provided on the surface of the wafer W and has a large thickness t. As shown in FIG. 6, in order to appropriately block the high energy ion beam B, the mask 80 on the wafer surface needs to be formed thick, and as a result, an aspect ratio of an opening portion 82 of the mask 80 increases. Therefore, if the ion beam is incident into the wafer W obliquely to the surface of the wafer W, the ion beam obliquely incident into the opening portion 82 is blocked at least partially by a side surface 81 or the like of the opening portion 82 because the opening portion 82 has the high aspect ratio. Therefore, an implantation area 84 corresponding to the opening portion 82 is difficult to be appropriately irradiated with the ion beam. Thus, in a case where the mask 80 having the opening portion 82 with high aspect ratio is used, the ion beam B should be incident almost perpendicularly to the wafer W, and thus, the incident angle θ of the ion beam B is restricted due to a mask configuration. In this case, the incident angle θ of the ion beam B cannot be optionally set in order to control the implantation profile.

Therefore, the present inventors tried to control the shape of the implantation profile formed in the wafer W by adjusting a temperature condition of the wafer W when the wafer is irradiated with the ion beam B. According to knowledge of the present inventors, by increasing the wafer temperature when the wafer W is irradiated with the ion beam B, the ions can be implanted under a situation in which the channeling is not easy to occur relatively (that is, off-channeling tends to occur). Conversely, by decreasing the wafer temperature when the wafer is irradiated with the ion beam B, the ions can be implanted under a situation in which the channeling is easy to occur relatively (that is, on-channeling tends to occur).

Figure 7:
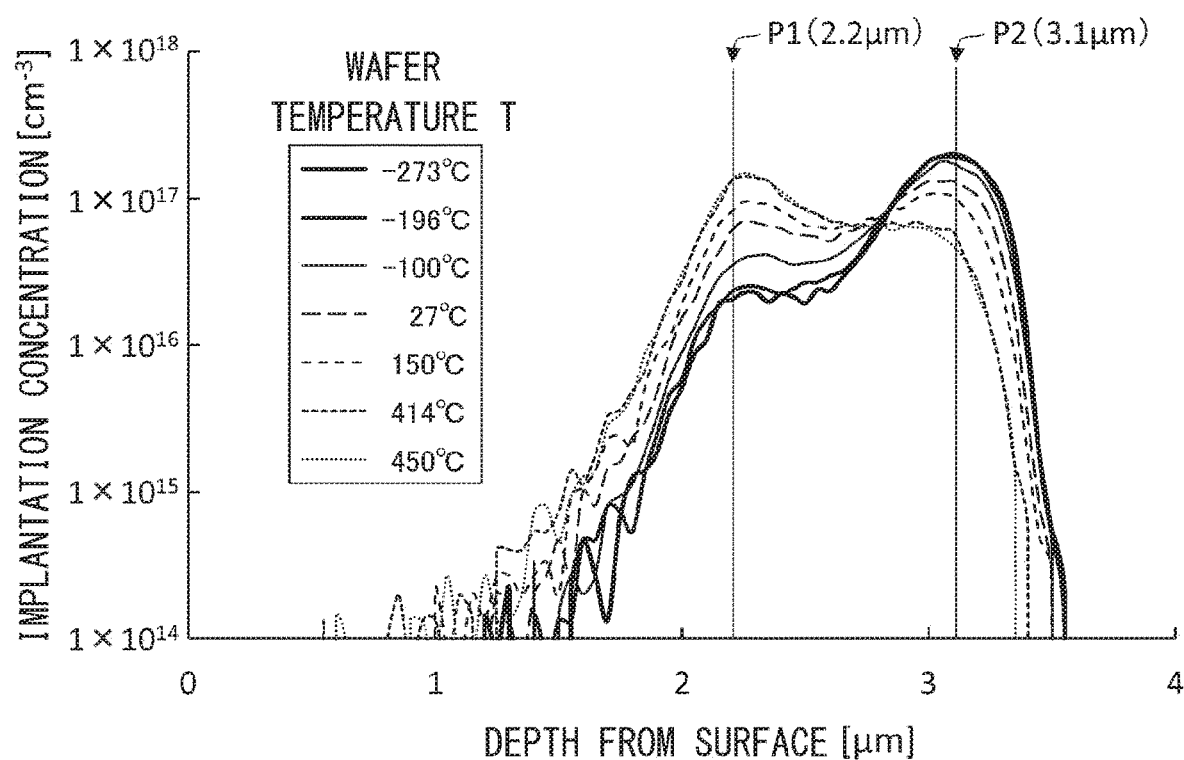
FIG. 7 is a graph showing an example of a relationship between a wafer temperature and the implantation profile in the depth direction formed in the wafer.

FIG. 7 is a graph showing an example of a relationship between a wafer temperature T and the implantation profile in the depth direction formed in the wafer W. Similarly to FIG. 3, FIG. 7 is a simulation result when the implanted ion is set to be boron (B), the implantation target is set to be the (100) plane of silicon (Si), the implantation energy is set to be 1.5 MeV, and the divergent angle of the ion beam B is set to be 0.4°. Meanwhile, in FIG. 7, the implantation angle θ of the ion beam B is fixed at 0°. The temperature T of the wafer W during the beam irradiation is set to be −273° C., −196° C., −100° C., 27° C., 150° C., 414° C. and 450° C. As shown in FIG. 7, the implantation profiles are generally distributed at deeper positions (to the right of the graph) as the wafer temperatures are lower. The first peak P1 of the implantation profile tends to be smaller as the wafer temperature T is lower and to be larger as the wafer temperature T is higher. Meanwhile, the second peak P2 of the implantation profile tends to be larger as the wafer temperature T is lower and to be smaller as the wafer temperature T is higher.

Figure 8:
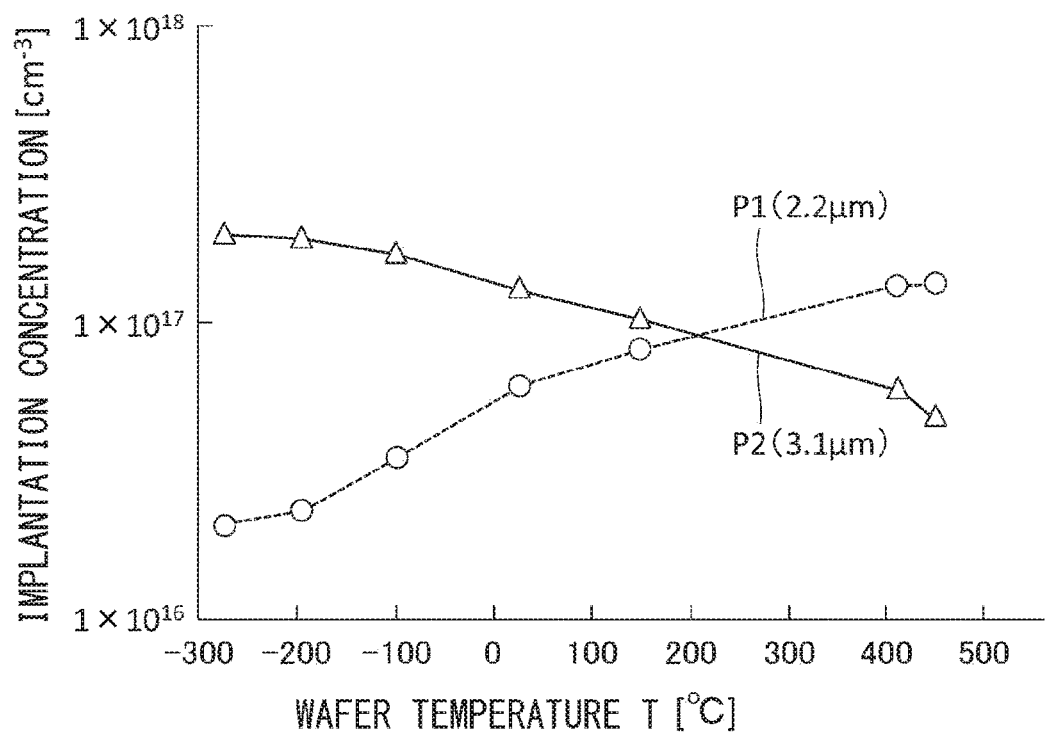
FIG. 8 is a graph showing an example of a relationship between the wafer temperature and implantation concentrations at two peak positions.

FIG. 8 is a graph showing an example of a relationship between the wafer temperature T and the implantation concentrations at the two peak positions P1 and P2 and corresponds to the implantation profiles shown in FIG. 7. The broken line P1 indicates the implantation concentration at a depth d=2.2 μm corresponding to the first peak, and the solid line P2 indicates implantation concentration at a depth d=3.1 μm corresponding to the second peak. As shown in FIG. 7, the implantation concentration at the first peak P1 tends to be lower as the wafer temperature T is lower and to be higher as the wafer temperature is higher. Meanwhile, the implantation concentration at the second peak P2 tends to be higher as the wafer temperature T is lower and to be lower as the wafer temperature is higher.

As described above, similarly to the case of changing the implantation angle θ, it is understood that the implantation profile can be changed by changing the wafer temperature T during the ion implantation. Specifically, by lowering the wafer temperature T, a state where the on-channeling is dominant can be realized. It is considered that this is because the channeling is easily occur when the temperature of the wafer W is lowered, movements of atoms constituting the crystal lattice of the wafer W decrease, and a probability of an interaction between the implanted ion and the crystal lattice of the wafer W decreases. Therefore, by lowering the wafer temperature T, it is possible to realize an implantation profile in which the spread in the in-plane direction is smaller at a deeper position. Meanwhile, by raising the wafer temperature T, a state where the off-channeling is dominant is realized, and thus, it is possible to realize an implantation profile in which the spread in the in-plane direction is larger at a shallower position.

In the present embodiment, the wafer W is heated or cooled to a predetermined temperature, and the wafer W having the predetermined temperature is irradiated with the ion beam B such that a predetermined channeling condition is satisfied. As a result, an implantation profile is realized, which is different from the implantation profile which is realized when the wafer W is irradiated with the ion beam B such that the predetermined channeling condition is satisfied at a temperature different from the predetermined temperature. For example, compared with a case where the wafer W is irradiated with the ion beam B at the room temperature (27° C.), in a case where the wafer W is irradiated with the ion beam B at a temperature lower than the room temperature, it is possible to realize an implantation profile in which the spread in the in-plane direction is smaller at a deeper position. Compared with a case where the wafer W is irradiated with the ion beam B at the room temperature, in a case where the wafer W is irradiated with the ion beam B at a temperature higher than the room temperature, it is possible to realize an implantation profile in which the spread in the in-plane direction is larger at a shallower position.

Here, it is repeated that the term "predetermined channeling condition" refers to the condition of the implantation angle θ in which the on-channeling is dominant under the room temperature condition, and for example, refers to the condition in which many of the angular components of the irradiating ion beam B are within the range of the critical angle θ which is calculated by Expression (1). As an example, the case where the predetermined channeling condition is satisfied is a case where at least a full width at half maximum of the angular distribution of the irradiating ion beam B is included in the on-channeling region C1.

For example, the ion implantation method according to the present embodiment can be applied to an isolation implantation or a photodiode implantation when a CMOS image sensor is manufactured. In the isolation implantation, for example, the above-described boron (B) can be used as an implant species, and in the photodiode implantation, phosphorus (P) or arsenic (As) can be used. The present embodiment can be applied a to high energy implantation, and the implantation energy of the high energy implantation can be set to be 200 keV to 20 MeV, for example. In this case, an implantation depth which can be realized is approximately 0.1 µm to 10 µm.

In a case where the implantation target is the (100) plane of silicon (Si), the critical angle θ based on the Expression (1) of boron (B), phosphorus (P), and arsenic (As) according to the implantation energy is as follows. In a case where the implantation energy is 200 keV, the critical angle $θ_c$ of boron (B) is 2.47°, and the critical angle $θ_c$ of phosphorus (P) is 4.27°, the critical angle θ of arsenic (As) is 6.34°. In a case where the implantation energy is 2 MeV, the critical angle $θ_c$ of boron (B) is 0.78°, the critical angle $θ_c$ of phosphorus (P) is 1.35°, and the critical angle $θ_c$ of arsenic (As) is 2.00°. In a case where the implantation energy is 10 MeV, the critical angle $θ_c$ of boron (B) is 0.35°, the critical angle $θ_c$ of phosphorus (P) is 0.60°, and the critical angle $θ_c$ of arsenic (As) is 0.90°. As described above, the critical angle $θ_c$ which provides the on-channeling depends on the ion species and the implantation energy, and thus, it is preferable to set an appropriate angular condition of the ion beam B according to the implantation condition. For example, the angular condition of the ion beam B corresponding to the predetermined channeling condition can be within 7°, within 5°, within 3°, or within 1° with respect to the crystal axis C.

Figure 9:
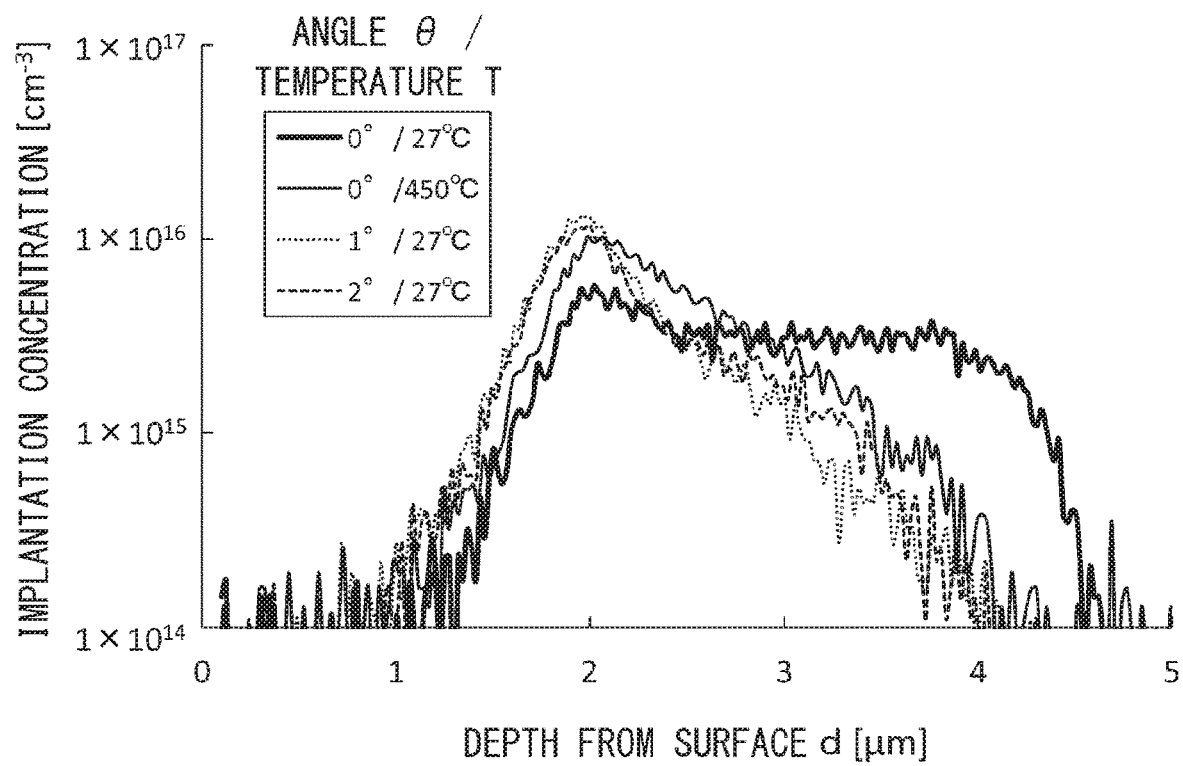
FIG. 9 is a graph showing an example of an implantation profile which is formed in the wafer when the wafer is irradiated with phosphorus (P) ions.

FIG. 9 is a graph showing an example of the implantation profile which is formed in the wafer when the wafer is irradiated with phosphorus (P) ions. FIG. 9 is a graph showing a measurement result by Secondary Ion Mass Spectrometry (SIMS). The implantation target is the (100) plane of silicon (Si), and the implantation energy is 2.2 MeV. As shown in FIG. 9, in a case where the implantation angle θ is 0° and the wafer temperature T is the room temperature (27° C.), the effect of the on-channeling is noticeable, and the implantation profile has a high implantation concentration which does not change largely over a depth range of 2 µm to 4 µm. Meanwhile, in a case where the wafer temperature T is a high temperature (450° C.) in a state where the implantation angle θ is 0°, or in a case where the implantation angle θ is 1° or 2° in a state where the wafer temperature T is the room temperature (27° C.), the implantation profile is formed, in which while there is a peak at a depth of approximately 2 µm under the off-channeling, the implantation concentration is low at a depth of approximately 3 µm to 4 µm. Therefore, also in a case where phosphorus (P) is implanted, by raising the wafer temperature T in a state where the implantation angle θ is fixed to be approximately 0°, it is possible to realize the implantation profile similar to the implantation profile obtained in a case where the implantation angle θ is set to be approximately the critical angle (for example, 1.29°) and the wafer temperature T is set to be the room temperature.

Figure 10:
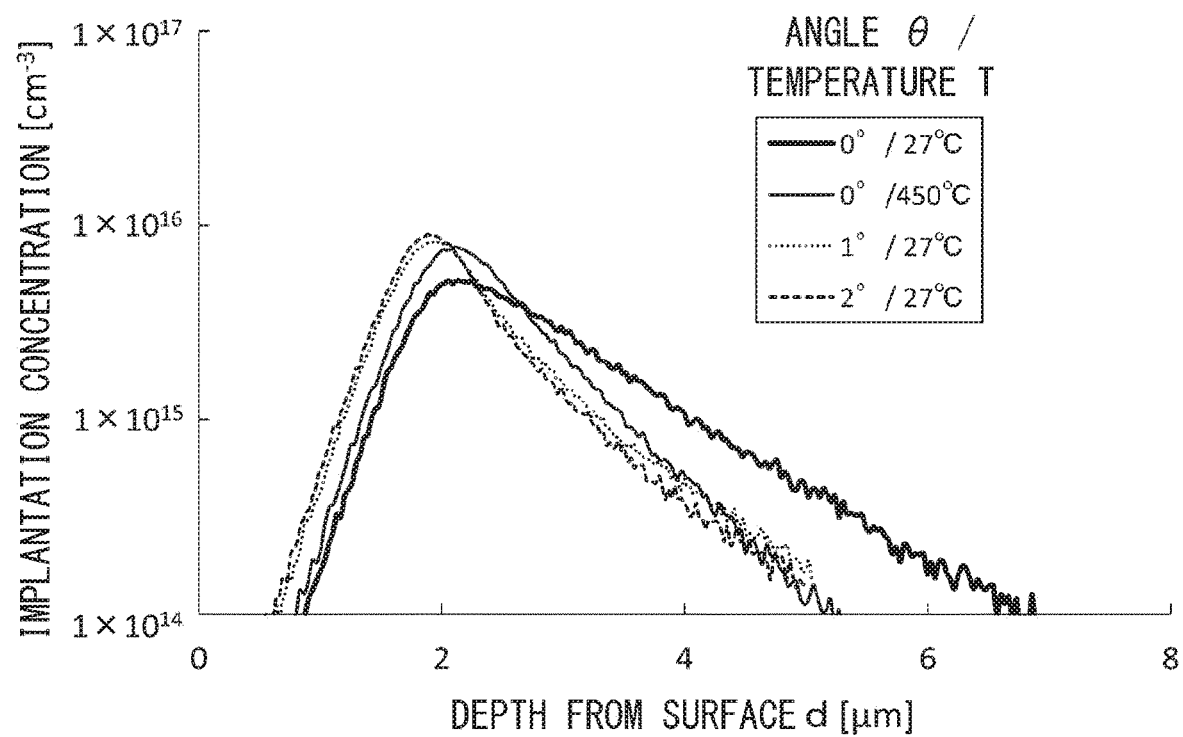
FIG. 10 is a graph showing an example of an implantation profile which is formed in the wafer when the wafer is irradiated with arsenic (As) ions.

FIG. 10 is a graph showing an example of the implantation profile which is formed in the wafer when the wafer is irradiated with arsenic (As) ions. FIG. 10 is a graph showing a measurement result by SIMS. The implantation target is the (100) plane of silicon (Si), and the implantation energy is 3.1 MeV. As shown in FIG. 10, in a case where the implantation angle θ is 0° and the wafer temperature T is the room temperature (27° C.), due to the effect of the on-channeling, the implantation profile is obtained in which the implantation concentration gently decreases over a range from the peak position having a depth of approximately 2 µm to a depth of approximately 6 µm. Meanwhile, in a case where the wafer temperature T is a high temperature (450° C.) in a state where the implantation angle θ is 0°, or in a case where the implantation angle θ is 1° or 2° in a state where the wafer temperature T is the room temperature (27° C.), the implantation profile is formed, in which there is a more prominent peak at a depth of approximately 2 µm under the off-channeling and thus, the implantation concentration more significantly decreases in a range of approximately 2 µm or more in the depth. Therefore, also in a case where arsenic (As) is implanted, by raising the wafer temperature T in a state where the implantation angle θ is fixed to be approximately 0°, it is possible to realize the implantation profile similar to the implantation profile obtained in a case where the implantation angle θ is set to be approximately the critical angle (for example, 1.61°) and the wafer temperature T is set to be the room temperature.

The present method can be applied to ion species other than B, P, and As, and for example, can be applied to nitrogen (N), aluminum (Al), gallium (Ga), indium (In), antimony (Sb), or the like.

In the method according to the present embodiment, it is preferable to set a dose of the irradiating ion beam B to be an approximately medium or less, and for example, preferably, the dose is $1 \times 10^{14}$ cm$^{-2}$ or less, or $1 \times 10^{13}$ cm$^{-2}$ or less. If the dose increases too much, implantation damage is accumulated in a region irradiated with the beam by the ion implantation process, the crystal structure becomes amorphous, and the crystal state is changed to a state in which the channeling is difficult to occur.

The present embodiment can be also applied to multiple implantations in which the same implantation region in the wafer surface is irradiated with the ion beams having different implantation energies. For example, the same implantation region is irradiated with three ion beams having high energy, medium energy, and low energy, the ions are implanted in three ranges which centers respectively correspond to three different depth positions, and thus, it is possible to form an implantation profile in which a region having a high implantation concentration is continuous in the depth direction. In this case, by performing the multiple implantations while changing the wafer temperature T, it is possible to more accurately control the shape of at least one of the implantation profiles in the depth direction and the implantation profile in the in-plane direction.

Figure 11A:
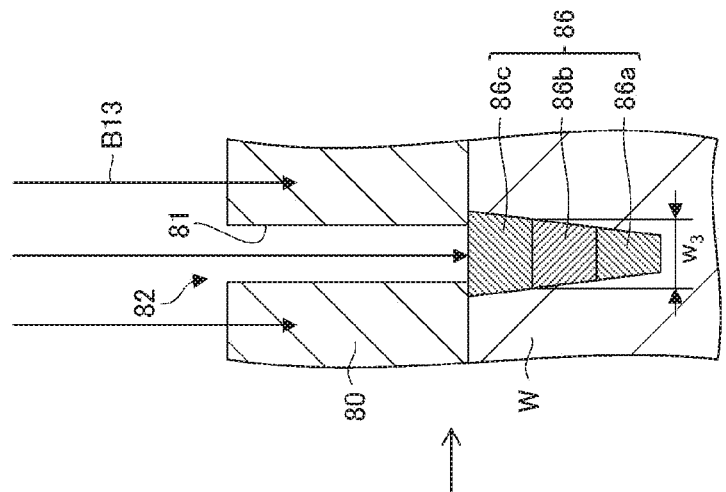
FIGS. 11A to 11C are cross sections schematically showing an example of a multiple implantations according to an embodiment.
Figure 11B:
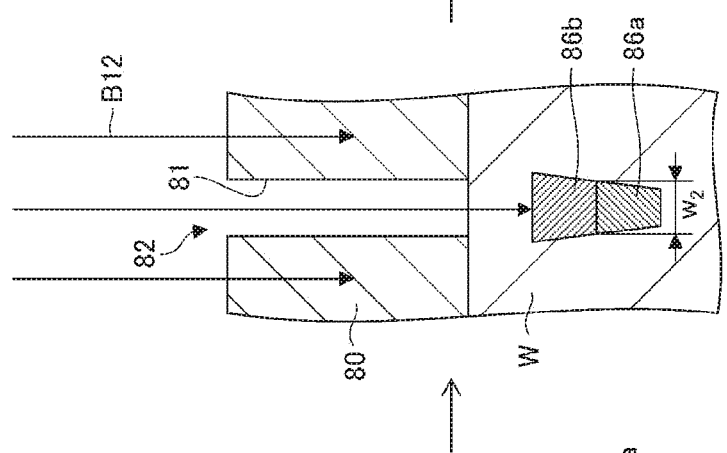
Figure 11C:
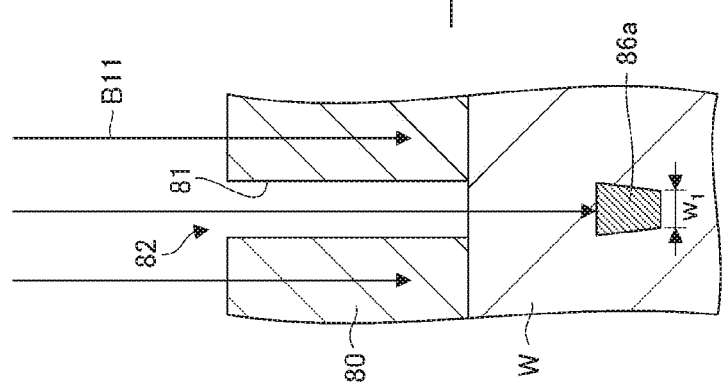

FIGS. 11A to 11C are cross sections schematically showing an example of a multiple implantations according to an embodiment. First, in a first process of FIG. 11A, a relatively deep first portion 86a in the implantation region corresponding to the opening portion 82 of the mask 80 is irradiated with a first ion beam B11 having high energy. Subsequently, in a second process of FIG. 11B, a second portion 86b positioned at an approximately medium depth in the implantation region corresponding to the opening portion 82 of the mask 80 is irradiated with a second ion beam B12 having medium energy. Thereafter, in a third process of FIG. 11C, a relatively shallow third portion 86c in the implantation region corresponding to the opening portion 82 of the mask 80 is irradiated with a third ion beam B13 having low energy. Accordingly, an implantation region 86 in which the first portion 86a, the second portion 86b, and the third portion 86c are continuous in the depth direction is formed.

The implantation angles of the irradiating ion beams B11 to B13 in the first process to the third process respectively shown in FIGS. 11A to 11C are the same, and the ion beams are approximately perpendicularly incident into the wafer surface such that a predetermined channeling condition is satisfied. Meanwhile, the wafer temperature T is changed in each of the first process to the third process. In the first process, by setting the wafer temperature T to be relatively low, the implantation condition in which the on-channeling is dominant is realized, and a width $w_1$ of the first portion 86a in the in-plane direction is small. In the second process, by setting the wafer temperature T to be medium, the contribution of the off-channeling increases, and a width $w_2$ of the second portion 86b in the in-plane direction is larger than the width $w_1$ of the first portion 86a. In the third process, by setting the wafer temperature T to be relatively high, the contribution of the off-channeling further increases, and a width $w_3$ of the third portion 86c in the in-plane direction is larger than the width $w_2$ of the second portion 86b. In this way, by performing the implantation process of the first process to the third process while changing the temperature conditions of the wafer, it is possible to form a trapezoidal implantation region 86 in which the widths $w_3$ to $w_1$ in the in-plane direction decrease in order as getting away from the wafer surface (that is, the implantation position gets deeper). Such a trench-type implantation profile can be used, for example as an isolation implantation region.

FIGS. 12A to 12C are cross sections schematically showing another example of the multiple implantations according to the embodiment. Similarly to FIGS. 11A to 11C, also in the example of FIGS. 12A to 12C, the portion corresponding to the opening portion 82 of the mask 80 is irradiated with ion beams B21 to B23 having different energies. First, a first portion 88a positioned at a relatively deep position is irradiated with the first ion beam B21 having high energy in a first process of FIG. 12A, then, a second portion 88b having an approximately medium depth is irradiated with the second ion beam B22 having medium energy in a second process of FIG. 12B, and at the last, a third portion 88c positioned at a relatively shallow position is irradiated with the third ion beam B23 having low energy in a third process of FIG. 12C. Accordingly, an implantation region 88 in which the first portion 88a, the second portion 88b, and the third portion 88c are continuous in the depth direction is formed.

Meanwhile, temperature conditions of the wafer W of the example shown in FIGS. 12A to 12C are changed reversely to the above-described temperature conditions of the wafer W in FIGS. 11A to 11C. Specifically, in the first process, by setting the wafer temperature T to be relatively high, the implantation condition in which the off-channeling is dominant is realized, and the width $w_1$ of the first portion 88a in the in-plane direction is large. In the second process, by setting the wafer temperature T to be medium, the contribution of the on-channeling contribution increases, and the width $w_2$ of the second portion 88b in the in-plane direction is smaller than the width $w_1$ of the first portion 88a. In the third process, by setting the wafer temperature T to be relatively low, the contribution of the on-channeling further increases, and the width $w_3$ of the third portion 88c in the in-plane direction is smaller than the width $w_2$ of the second portion 88b. In this way, by performing the implantation process of the first process to the third process while changing the temperature conditions of the wafer, it is possible to form the implantation region 88 having the shape in which the widths $w_3$ to $w_1$ in the in-plane direction increase in order as getting away from the wafer surface (that is, the implantation position gets deeper). Such another trench-type implantation profile can be used, for example, as a photodiode implantation region adjacent to the isolation implantation region 86 shown in FIG. 11C.

In the above-described examples, the number of the processes of the multi-stage implantations is three. However, the number of the processes of the multiple implantations may be two or four or more. In addition, only the wafer temperature T and the implantation energy may be changed in a state where the implantation angle of the irradiating ion beam in the multiple implantations is fixed, and the implantation angle may be changed between the processes.

In a case where the wafer temperature is changed, for example, it is possible to change the temperature within a range of −200° C. to 500° C. By setting the change range of the temperature to be the range of −100° C. to 400° C., it is possible to adjust the temperature T of the wafer using a relatively simple temperature adjustment device. In a case where the wafer temperature T is changed between the processes of the multiple implantations, it is preferable to set the temperature difference between processes to be 50° C. or more. By changing the wafer temperature T by 50° C. or more, preferably by 100° C. or more, a ratio of contributions of the on-channeling and the off-channeling occurring in a single implantation process can be significantly changed, and thus, it is possible to adjust the shape of the implantation profile in the depth direction and the in-plane direction such that a desired implantation profile is obtained.

Subsequently, an ion implanter for performing the above-described ion implantation method will be described.

Figure 13:
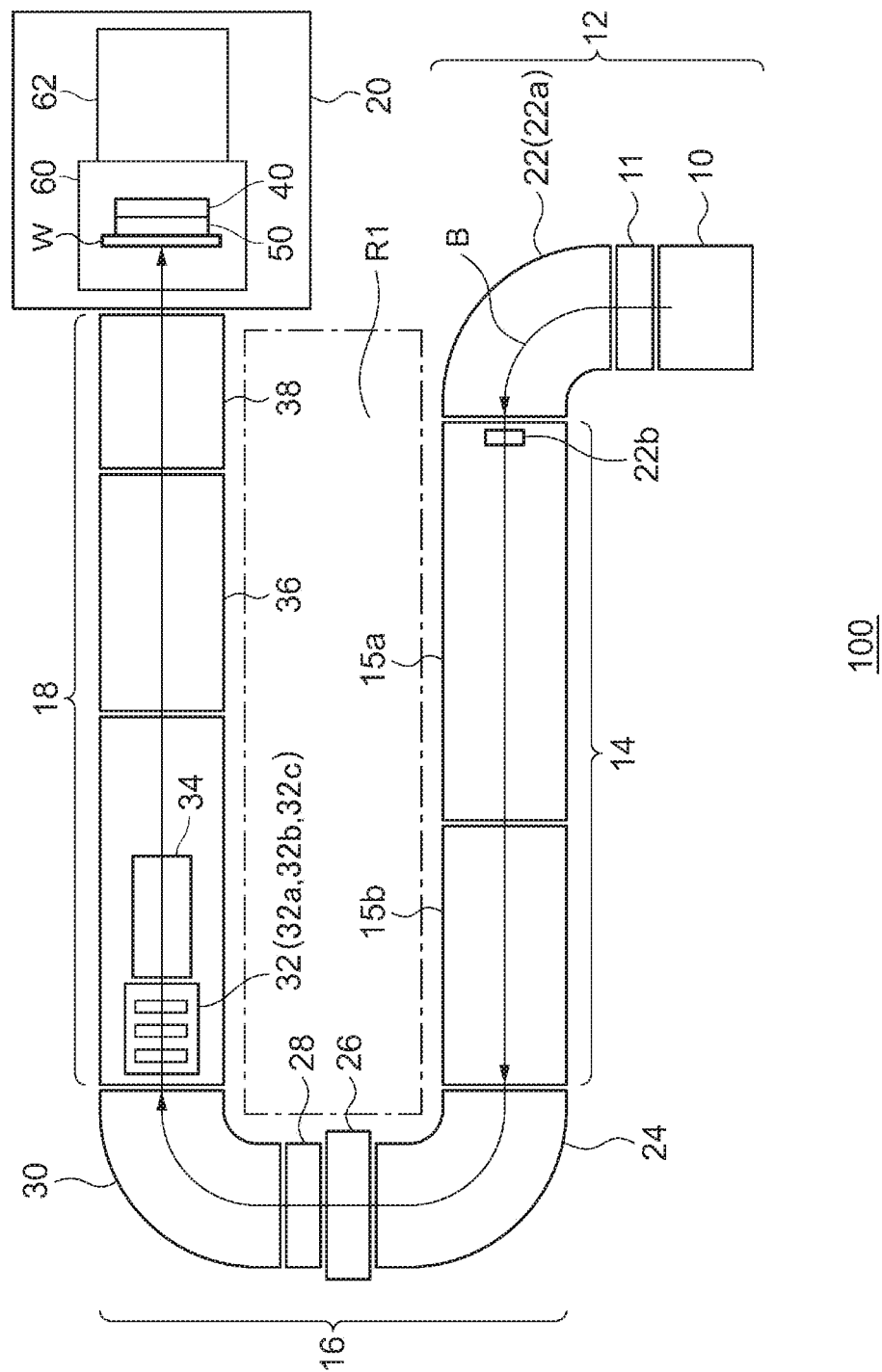
FIG. 13 is a top view showing a schematic configuration of an ion implanter according to the embodiment.

FIG. 13 is a top view schematically showing an ion implanter 100 according to the embodiment. The ion implanter 100 is a so-called high energy ion implanter. The high energy ion implanter is an ion implanter having a radio frequency linear acceleration-type ion accelerator and a beamline for transporting high energy ions, and the high energy ion implanter accelerates ions generated by an ion source 10, transports the obtained ion beam B to a processing object (for example, substrate or wafer W) along the beamline, and implants the ions into the processing object.

The high energy ion implanter 100 includes an ion beam generation unit 12 which generates ions and perform mass separation of the ions, a high energy multiple linear acceleration unit 14 which accelerates the ion beam to obtain a high energy ion beam, a beam deflection unit 16 which performs an energy analysis, an energy dispersion control, and a trajectory correction of the high energy ion beam, a beam transport line unit 18 which transports the analyzed high energy ion beam to the wafer W, and a substrate transporting/processing unit 20 which implants the transported high energy ion beam into a semiconductor wafer.

The ion beam generation unit 12 has the ion source 10, an extraction electrode 11, and a mass analyzer 22. In the ion beam generation unit 12, a beam is extracted from the ion source 10 through the extraction electrode 11 and simultaneously accelerated, and the extracted and accelerated beam is mass-analyzed by the mass analyzer 22. The mass analyzer 22 has a mass analyzing magnet 22a and a mass analyzing slit 22b. The mass analyzing slit 22b may be disposed immediately behind the mass analyzing magnet 22a. However, in the embodiment, the mass analyzing slit 22b is disposed in an entrance of the high energy multistage linear acceleration unit 14 which is the following configuration. As a result of the mass analysis by the mass analyzer 22, only ion species necessary for the implantation is selected, and the ion beam of the selected ion species is introduced to the following high energy multistage linear acceleration unit 14.

The high energy multistage linear acceleration unit 14 includes a plurality of linear accelerator which performs the acceleration of the ion beam, that is, one or more radio frequency resonators. The high energy multistage linear acceleration unit 14 can accelerate the ions by an action of a radio frequency (RF) electric field. The high energy multistage linear acceleration unit 14 includes a first linear acceleration unit 15a having a standard multistage of radio frequency resonators for high energy ion implantation. The high energy multistage linear acceleration unit 14 may additionally include a second linear acceleration unit 15b having an additional multistage of radio frequency resonators for ultra-high energy ion implantation. A direction of the ion beam which is further accelerated by the high energy multistage linear acceleration unit 14 is changed by the beam deflection unit 16.

The high energy ion beam, which exits from the radio frequency-type high energy multistage linear acceleration unit 14 which accelerates the ion beam to high energy, has a certain range of energy distribution. Therefore, in order to perform beam scanning and beam parallelization on the high energy ion beam in a downstream side of the high energy multistage linear acceleration unit 14 so as to irradiate the wafer with the ion beam, it is necessary to perform a high accuracy energy analysis, the trajectory correction, and adjustment of a beam convergence/divergence in advance.

The beam deflection unit 16 performs the energy analysis, the energy dispersion control, and the trajectory correction of the high energy ion beam. The beam deflection unit 16 includes at least two high accuracy deflecting electromagnets, at least one energy width limiting slit, at least one energy analyzing slit, and at least one horizontally focusing device. The plurality of deflecting electromagnets are configured to perform the energy analysis and the accurate ion implantation angle correction of the high energy ion beam.

The beam deflection unit 16 has an energy analyzing electromagnet 24, a horizontally focusing quadrupole lens 26 for suppressing energy dispersion, an energy analyzing slit 28, and a deflecting electromagnet 30 for providing beam steering (trajectory correction). The energy analyzing electromagnet 24 may also be referred to as an energy filter electromagnet (EFM). The direction of the high energy ion beam is turned by the beam deflection unit 16 and the high energy ion beam heads toward the wafer W.

The beam transport line unit 18 is a beamline device which transports the ion beam B exiting from the beam deflection unit 16 and the beam transport line unit 18 includes a beam shaper 32 constituted by a focusing/defocusing lens group, a beam scanner 34, a beam parallelizer 36, and a final energy filter 38 (including a final energy separating slit). A length of the beam transport line unit 18 is designed to match a combined length of the ion beam generation unit 12 and the high energy multistage linear acceleration unit 14. The beam transport line unit 18 and the high energy multistage linear acceleration unit 14 are connected by the beam deflection unit 16 to form an entire U-shaped layout.

A substrate transporting/processing unit 20 is provided on a downstream end of the beam transport line unit 18. The substrate transporting/processing unit 20 includes an ion implantation chamber 60 and a substrate transfer unit 62. The ion implantation chamber 60 includes a platen driving unit 40 which holds the wafer W during the ion implantation and moves the wafer W in a direction perpendicular to a beam scanning direction. The platen driving unit 40 includes a temperature adjustment device 50 for adjusting the wafer temperature T during the ion implantation. In the substrate transfer unit 62, a wafer transfer mechanism such as a transfer robot which loads the wafer W before the ion implantation into the ion implantation chamber 60 and unloads the wafer W subjected to the ion implantation from the ion implantation chamber 60 is provided.

A beamline portion of the ion implanter 100 is constituted as a horizontally folded U-shaped beamline having two long straight portions facing each other. An upstream long straight portion is constituted by a plurality of units which accelerate the ion beam B generated by the ion beam generation unit 12. A downstream long straight portion is turned with respect to the upstream long straight portion and constituted by a plurality of units which adjust the ion beam B t and implant the adjusted ion beam B into the wafer W. The two long straight portions are configured to have substantially the same length. A workspace R1 having a sufficient area for a maintenance work is provided between the two long straight portions.

Figure 14A:
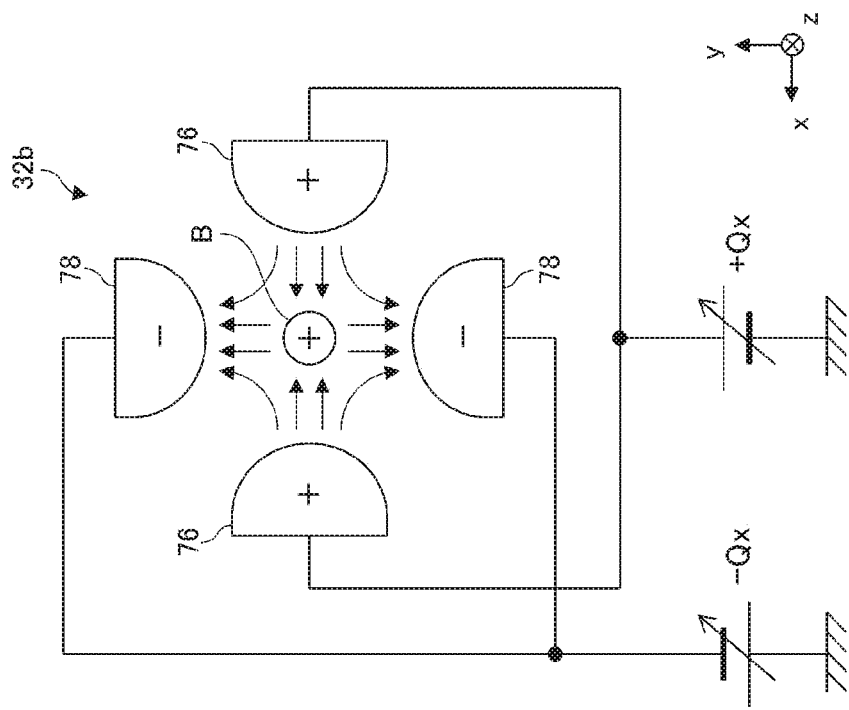
FIGS. 14A and 14B are diagrams schematically showing a configuration of a lens device included in a beam shaper.
Figure 14B:
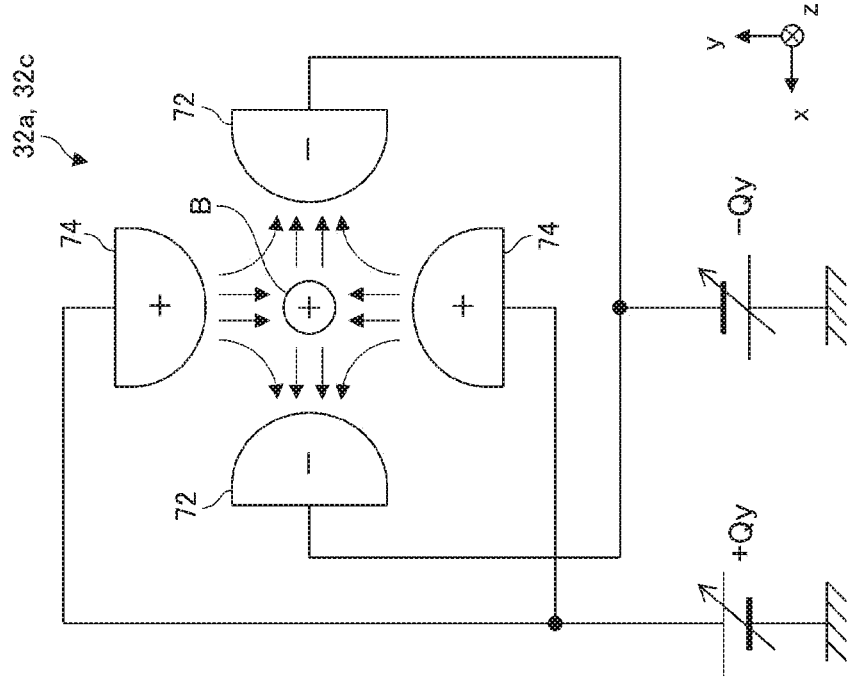

FIGS. 14A and 14B are diagrams schematically showing configurations of lens devices 32a, 32b, and 32c included in the beam shaper 32. For example, the beam shaper 32 shown in FIG. 13 includes three quadrupole lens devices 32a to 32c, and the first lens device 32a, the second lens device 32b, and the third lens device 32c are disposed in this order from an upstream side toward a downstream side of a beam trajectory. FIG. 14A shows the configurations of the first lens device 32a and the third lens device 32c which focus the ion beam B in a vertical direction (y direction), and FIG. 14B shows the configuration of the second lens device 32b which focuses the ion beam B in a horizontal direction (x direction).

The first lens device 32a of FIG. 14A has a pair of horizontally facing electrodes 72 which faces each other in the horizontal direction (x direction) and a pair of vertically facing electrodes 74 which faces each other in the vertical direction (y direction). A negative potential $-Q_y$ is applied to the pair of horizontally facing electrodes 72, and a positive potential $+Q_y$ is applied to the pair of vertically facing electrodes 74. The first lens device 32a generates an attractive force for an ion beam B, which is constituted as an ion group having positive charge, between the pair of horizontally facing electrodes 72 having the negative potential, and generates a repulsive force for the ion beam B between the pair of vertically facing electrodes 74 having the positive potential. Accordingly, the first lens device 32a adjusts the beam shape so as to defocus the ion beam B in the x direction and focus the ion beam B in the y direction. The third lens device 32c is configured in the same manner as the first lens device 32a, and the same potentials as the first lens device 32a are applied to the third lens device 32c.

The second lens device 32b of FIG. 14B has a pair of horizontally facing electrodes 76 which faces each other in the horizontal direction (x direction) and a pair of vertically facing electrodes 78 which faces each other in the vertical direction (y direction). While the second lens device 32b is configured in the same manner as the first lens device 32a, the positive and the negative of the applied potentials are reversed. A positive potential +Qx is applied to the pair of horizontally facing electrodes 76, and a negative potential −Qx is applied to the pair of vertically facing electrodes 78. The second lens device 32b generates a repulsive force for the ion beam B, which is constituted as the ion group having positive charges, between the pair of horizontally facing electrodes 76 having the positive potential, and generates an attractive force for the ion beam B between the pair of vertically facing electrodes 78 having the negative potential. Accordingly, the second lens device 32b adjusts the beam shape so as to focus the ion beam B in the x direction and defocus the ion beam B in the y direction.

Figure 15:
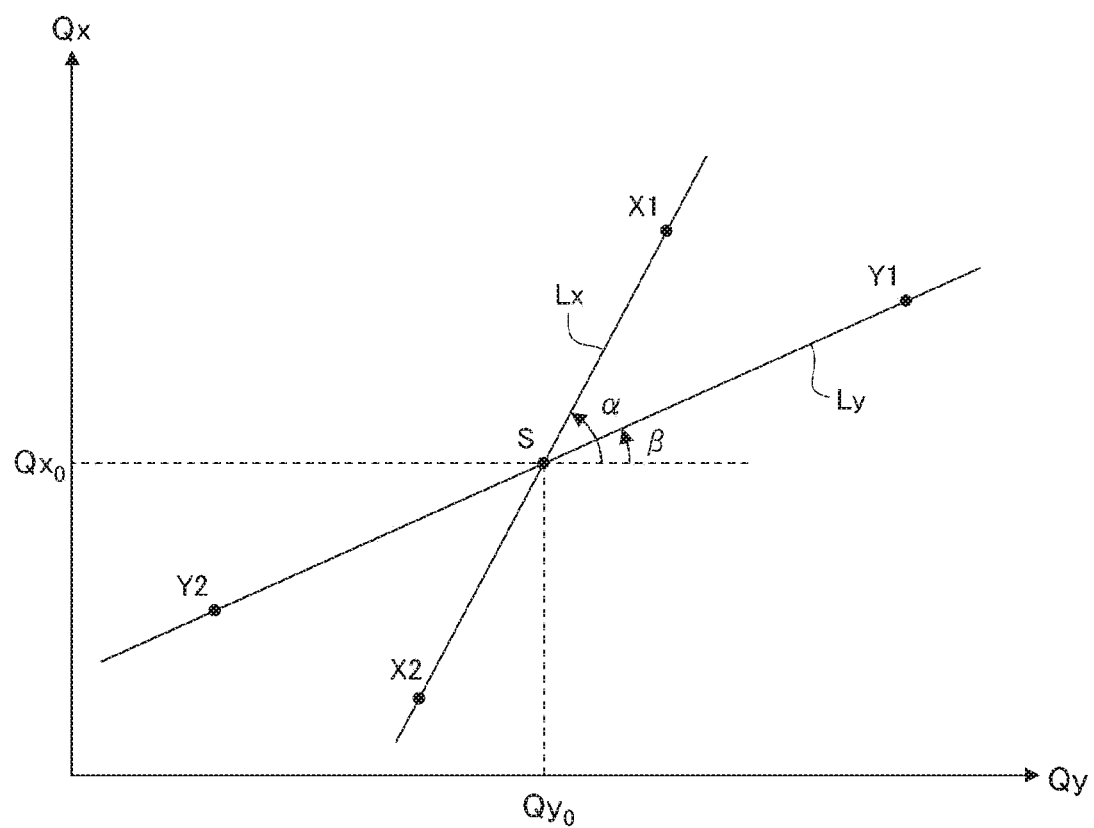
FIG. 15 is a graph schematically showing an example of controlling a convergence/divergence of the ion beam by the lens device.

FIG. 15 is a graph schematically showing an example of controlling a convergence/divergence of the ion beams B by the lens devices 32a to 32c, and shows a relationship between potentials Qx and Qy applied to the facing electrodes of each of the lens devices 32a to 32c and an angular distribution of the shaped beam. A vertically focusing potential Qy on a horizontal axis indicates an absolute value of the potential applied to each of the first lens device 32a and the third lens device 32c, and a horizontally focusing potential Qx on a vertical axis indicates an absolute value of the potential applied to the second lens device 32b.

A point S at which predetermined potentials $Qx_0$ and $Qy_0$ are applied means an operation condition which generates the "parallel beam" in which the spreads in implantation angle distributions in both the x direction and the y direction are small as shown in FIGS. 2A and 2B. By changing the potentials $Qx_0$ and $Qy_0$ along a straight line Lx from the point S, it is possible to adjust the beam such that only the implantation angle distribution in the x direction is changed and the implantation angle distribution in the y direction is not changed. If the horizontally focusing potential Qx is raised from the point S to a point X1, the beam becomes a "convergent beam" which is convergent in the x direction, and thus, the spread of the implantation angle distribution in the x direction increases. Meanwhile, if the horizontally focusing potential Qx is lowered from the point S to a point X2, the beam becomes a "divergent beam" which is divergent in the x direction, and thus, the spread of the implantation angle distribution in the x direction increases.

Similarly, by changing the potentials Qx and Qy along a straight line Ly from the point S, it is possible to adjust the beam such that only the implantation angle distribution in the y direction is changed and the implantation angle distribution in the x direction is not changed. If the vertically focusing potential Qy is raised from the point S to a point Y1, the beam becomes a "convergent beam" which is convergent in the y direction, and thus, the spread of the implantation angle distribution in the y direction increases. Meanwhile, if the vertically focusing potential Qy is lowered from the point S to a point Y2, the beam becomes a "divergent beam" which is divergent in the y direction, and thus, the spread of the implantation angle distribution in the y direction increases.

In this way, by changing the potentials Qx and Qy applied to each of the three-stage lens devices 32a to 32c under a predetermined condition, the implantation angle distributions in the x direction and the y direction of the irradiating ion beam for the wafer W can be controlled independently. For example, in a case where only the implantation angle distribution in the x direction is to be adjusted, the potentials Qx and Qy maybe changed in accordance with an inclination of the straight line Lx such that a relationship of $\Delta Qx = \alpha \cdot \Delta Qy$ is maintained. Similarly, in a case where only the implantation angle distribution in the y direction is to be adjusted, the potentials Qx and Qy may be changed in accordance with an inclination of the straight line Ly such that a relationship of $\Delta Qx = \beta \cdot \Delta Qy$ is maintained. The values of the inclinations $\alpha$ and $\beta$ of the straight lines Lx and Ly may be appropriately determined according to ion beam optical characteristics of the lens device used. In the present embodiment, the angular distribution of the ion beam B can be controlled, for example, with an accuracy of 0.1° or less.

Figure 16:
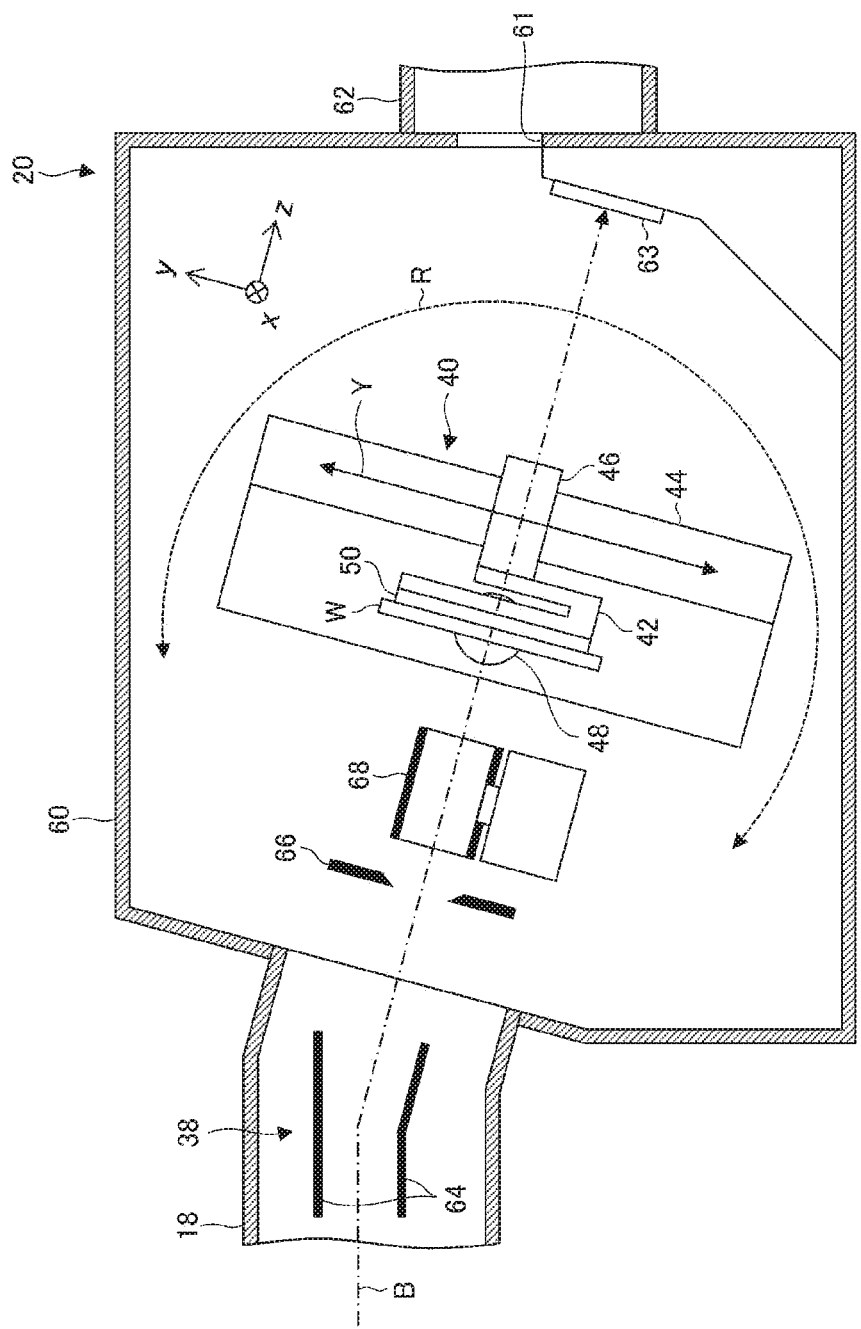
FIG. 16 is a side view showing a configuration of a substrate transporting/processing unit in detail.

FIG. 16 is a side view showing a configuration of the substrate transporting/processing unit 20 in detail and shows a configuration on a downstream side of the final energy filter 38. The ion beam B is deflected downward through Angular Energy Filter (AEF) electrodes 64 of the final energy filter 38 and is incident into the substrate transporting/processing unit 20. The substrate transporting/processing unit 20 includes an ion implantation chamber 60 in which the ion implantation process is performed and a substrate transfer unit 62 in which a transfer mechanism for transferring the wafer W is provided. The ion implantation chamber 60 and the substrate transfer unit 62 are connected to each other via a substrate transfer port 61.

The ion implantation chamber 60 includes the platen driving unit 40 which holds one or more wafer W. The platen driving unit 40 includes a wafer holding device 42, a reciprocating motion mechanism 44, a twist angle adjustment mechanism 46, and a tilt angle adjustment mechanism 48. The wafer holding device 42 includes an electrostatic chuck or the like for holding the wafer W. The reciprocating motion mechanism 44 reciprocates the wafer holding device 42 in a reciprocating direction (y direction) perpendicular to a beam scanning direction (x direction), and thus, the wafer W which is held by the wafer holding device 42 is reciprocated in the y direction. In FIG. 16, a reciprocating motion of the wafer W is exemplified by an arrow Y.

The twist angle adjustment mechanism 46 is a mechanism which adjusts a rotation angle of the wafer W, and rotates the wafer W with a normal of a wafer processing surface as a rotation axis so as to adjust a twist angle between an alignment mark provided on an outer peripheral portion of the wafer and a reference position. Here, the alignment mark of the wafer means a notch, an orientation flat, or the like which is provided on the outer peripheral portion of the wafer, and means a mark serving as a reference for an angular position in a crystal axis direction of the wafer or in a circumferential direction of the wafer. The twist angle adjustment mechanism 46 is provided between the wafer holding device 42 and the reciprocating motion mechanism 44, and is reciprocated together with the wafer holding device 42.

The tilt angle adjustment mechanism 48 is a mechanism which adjusts the inclination of the wafer W, and adjusts a tilt angle between the traveling direction (z direction) of the ion beam B toward the wafer processing surface and the normal of the wafer processing surface. In the present embodiment, among the inclination angles of the wafer W, an angle with an axis in the x direction as a central axis of the rotation is adjusted as the tilt angle. The tilt angle adjustment mechanism 48 is provided between the reciprocating motion mechanism 44 and a side wall of the ion implantation chamber 60 and is configured to adjust the tilt angle of the wafer W by rotating the entire platen driving unit 40 including the reciprocating motion mechanism 44 in an R direction.

In the ion implantation chamber 60, an energy defining slit 66, a plasma shower device 68, and a beam damper 63 are provided along the trajectory of the ion beam B from the upstream side toward the downstream side.

The energy defining slit 66 is provided on a downstream side of the AEF electrodes 64 and performs an energy analysis of the ion beam B to be incident into the wafer W together with the AEF electrodes 64. The energy defining slit 66 is an Energy Defining Slit (EDS) configured of a slit long in the beam scanning direction (x direction). The energy defining slit 66 causes the ion beams having a desired energy value or a desired energy range to pass toward the wafer W and block the other ions.

The plasma shower device 68 is positioned on a downstream side of the energy defining slit 66. The plasma shower device 68 supplies low energy electrons to the ion beam B and the wafer processing surface in corresponding to a beam current of the ion beam B, and suppresses charge-up due to positive charge accumulated on the wafer processing surface which result from the ion implantation. the plasma shower device 68 includes, for example, a shower tube through which the ion beam B passes and a plasma generating device which supplies electrons into the shower tube.

The beam damper 63 is provided on the most downstream side of the beam trajectory, and for example, is attached below the substrate transfer port 61. Accordingly, in a case where the wafer W does not exist on the beam trajectory, the ion beam B is incident into the beam damper 63. A beam measuring device for measuring the ion beam B may be provided in the beam damper 63.

The temperature adjustment device 50 is attached to the wafer holding device 42 included in the platen driving unit 40. The temperature adjustment device 50 heats or cools the wafer W, which is held by the wafer holding device 42, so as to adjust the temperature T of the wafer W. The temperature adjustment device 50 includes at least one of a heating unit and a cooling unit. For example, the heating unit includes a heating wire, causes a current to flow through the heating wire so as to heat the heating wire, and thus, heats the wafer W. For example, the cooling unit includes a cooling flow path through which a refrigerant flows, and cools the wafer W by the refrigerant flowing through the cooling flow path. The temperature adjustment device 50 may include a temperature meter for measuring the temperature T of the wafer W and may heat or cool the wafer W such that the temperature of the wafer W measured by the temperature meter becomes a desired temperature.

The temperature adjustment device 50 may be provided at a position different from that of the wafer holding device 42. For example, a heating element may be disposed in the vicinity of an exit of the plasma shower device 68 and the wafer W may be heated using radiant heat from the heating element. The temperature adjustment device 50 may be provided in middle of the wafer transfer path leading to the ion implantation chamber 60 or may be provided in a preliminary chamber different from the ion implantation chamber 60. The temperature of the wafer W may be adjusted by using both the temperature adjustment device 50 provided in the wafer holding device 42 and another temperature adjustment device provided at a position different from that of the wafer holding device 42.

Figure 17:
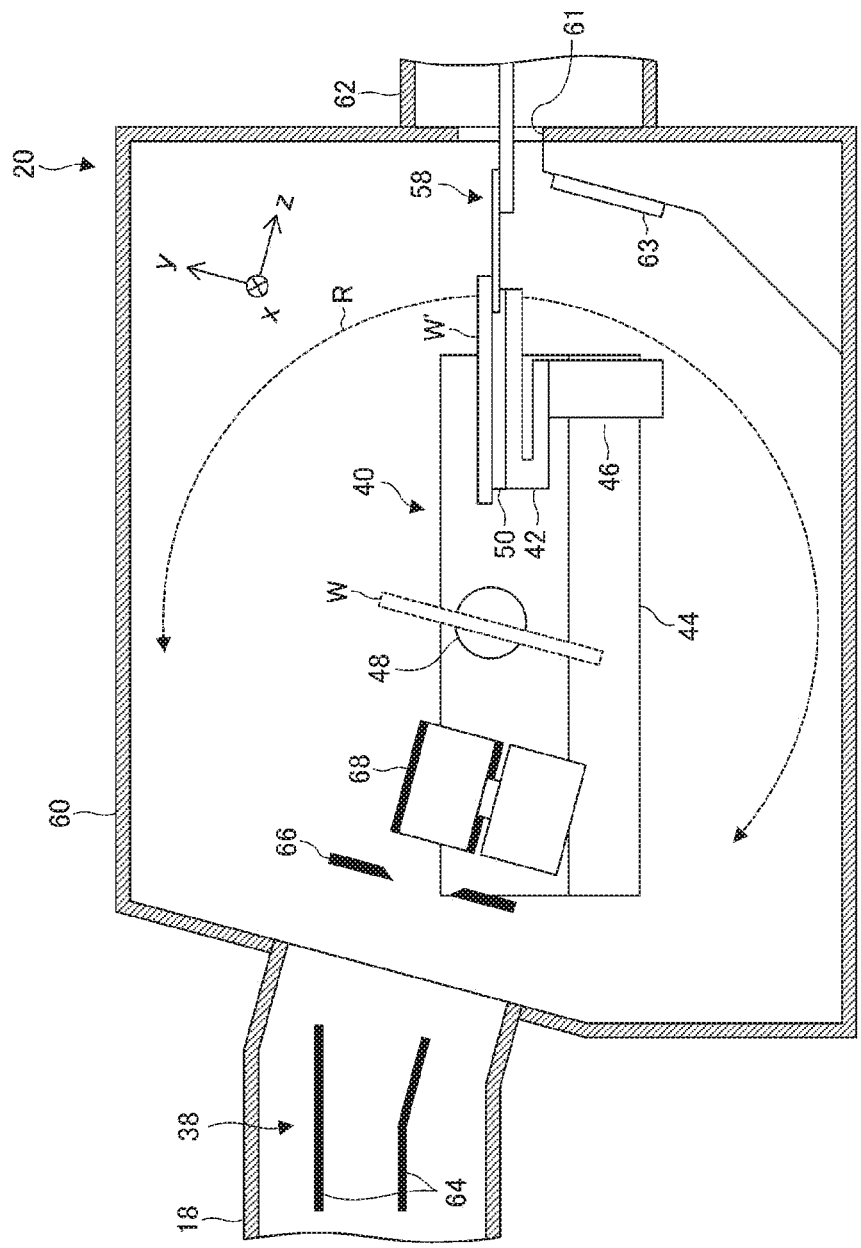
FIG. 17 is a side view schematically showing a process of disposing the wafer on a wafer holding device.

FIG. 17 is a side view schematically showing a process of loading a wafer W' on the wafer holding device 42. In FIG. 17, a solid line indicates the wafer W' which is disposed at a loading/unloading position at which the wafer is loaded and unloaded between the wafer holding device 42 and the substrate transfer unit 62, and a broken line indicates the wafer W which is disposed at the implantation position at which the wafer is irradiated with the ion beam B inside the ion implantation chamber 60. The platen driving unit 40 moves the wafers W and W' between the implantation position and the loading/unloading position mainly by a combination of a rotating movement in the R direction by the tilt angle adjustment mechanism 48 and a linear movement in the Y direction by the reciprocating motion mechanism 44. The wafer W' positioned at the loading/unloading position is loaded and unloaded through the substrate transfer port 61 by a substrate transfer robot 58 provided in the substrate transfer unit 62.

Figure 18A:
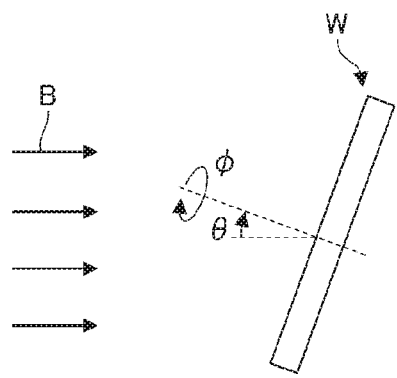
FIGS. 18A and 18B are diagrams schematically showing an orientation of the wafer with respect to an incident direction of the ion beam.
Figure 18B:
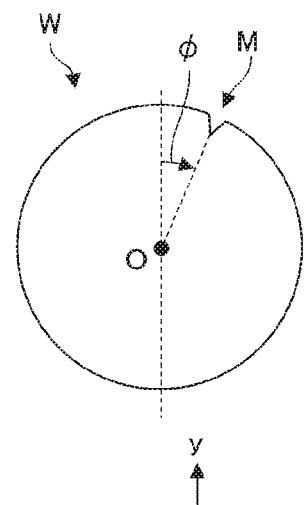

FIGS. 18A and 18B are diagrams schematically showing an orientation of the wafer W with respect to an incident direction of the ion beam B. FIG. 18A shows a state where the wafer W is inclined with respect to the incident direction of the ion beam B (z direction) and thus, a tilt angle θ which is not 0° is set. As shown in FIG. 18A, the tilt angle θ is set as a rotation angle by which the wafer W is rotated around the x axis. In a state where the tilt angle θ=0°, the ion beam B is perpendicularly incident into the wafer W. FIG. 18B shows a state where the wafer W is rotated around an axis which goes through a center O of the wafer W and is perpendicular to the wafer main surface, and thus, a twist angle φ which is not 0° is set. As shown in FIG. 18B, the twist angle φ is set as a rotation angle by which the wafer W is rotated around the axis perpendicular to the wafer main surface. In a state where the twist angle φ=0°, a line extending from the center O of the wafer W to an alignment mark M coincides with the y direction. When disposing the wafer W with respect to the ion beam B, appropriately setting the tilt angle θ and the twist angle φ can realize a predetermined channeling condition.

Figure 19A:
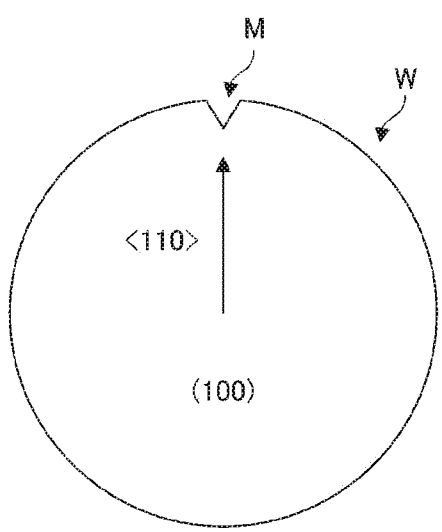
FIGS. 19A and 19B are diagrams schematically showing the wafer which is a target of an ion implantation process target.
Figure 19B:
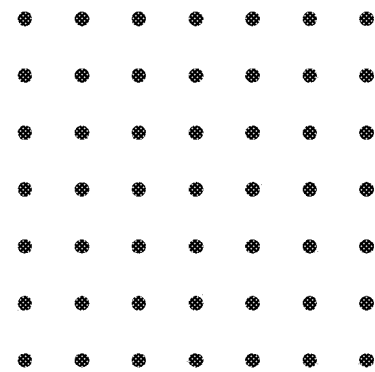

FIGS. 19A and 19B are diagrams schematically showing the wafer which is a target of the ion implantation process. FIG. 19A shows a crystal orientation of the wafer W, and FIG. 19B shows an atomic arrangement in the vicinity of the surface of the wafer W. As the wafer W which is the implantation target, a single crystal silicon substrate in which a plane orientation of the wafer main surface is the (100) plane can be used. The alignment mark M of the wafer W is provided at a position indicating <110> orientation.

Figure 20A:
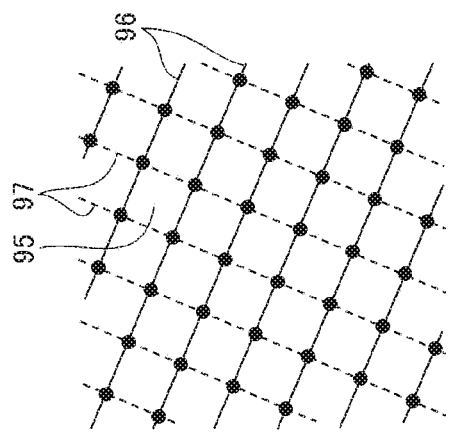
FIGS. 20A to 20C are diagrams schematically showing a relationship between the orientation of the wafer and an atomic arrangement in the vicinity of a surface of the wafer.
Figure 20B:
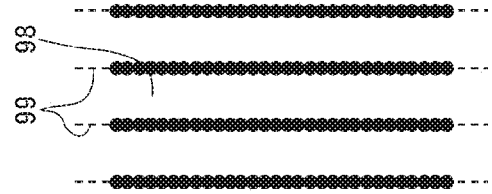
Figure 20C:
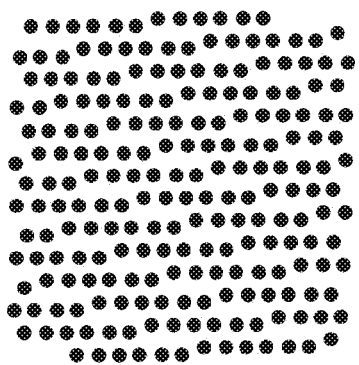

FIGS. 20A to 20C are diagrams schematically showing a relationship between the orientation of the wafer W and the atomic arrangement in the vicinity of the surface of the wafer W. FIGS. 20A to 20C are diagrams schematically showing the atomic arrangements in the vicinity of the wafer Wand show the atomic arrangements when viewed from the ion beam B incident into the wafer W. In FIGS. 20A to 20C, positions of silicon atoms are indicated by black circles. In addition, the silicon atoms positioned at different positions in a depth direction (z direction) are drawn in a xy plane in an overlapping manner.

FIG. 20A shows an atomic arrangement in a case where the atoms are disposed to satisfy an axial channeling condition and shows a case where the wafer W is disposed in an orientation at the twist angle φ=23° and the tilt angle θ=0°. In the shown axial channeling condition, a plurality of first crystal planes 96 formed of silicon atoms disposed on solid lines and a plurality of second crystal planes 97 formed of silicon atoms disposed on broken lines cross each other to be disposed as a lattice, and thus, "axial channels" 95 are formed, which are axial clearances extending in one dimension along the direction in which the ions are implanted. As a result, in the ion beam having an angular distribution in at least one of the x direction and the y direction, only the ions traveling straight in the z direction causes the channeling phenomenon, and the ions having angular components deviated to some extent from the z direction are blocked by any crystal plane and does not cause the channeling phenomenon. Accordingly, the wafer W disposed to satisfy the axial channeling condition generates the "axial channeling" which occurs on the ions traveling axially along the incident direction of the ion beam B.

The disposition which satisfies the axial channeling condition is not limited to the above-described settings of the twist angle and tilt angle. Other twist angles and tilt angles may be used as long as the wafer is disposed such that the atomic arrangement shown in FIG. 20A is realized. In order to realize the axial channeling condition, for example, the twist angle φ of the wafer W may be substantially in a range of 15° to 30°, and the tilt angle θ of the wafer may be substantially 0°.

FIG. 20B shows an atomic arrangement in a case where the atoms are disposed to satisfy a plane channeling condition and shows a case where the wafer W is disposed in an orientation at the twist angle φ=0° and the tilt angle θ=15°. In the shown plane channeling condition, a plurality of crystal planes 99 are formed by silicon atoms arranged in a yz plane, and a "planar channel" 98 which are clearances having a two-dimensional spread between the crystal planes 99 facing each other in the x direction is formed. As a result, in the ion beam having an angular distribution in the x direction, only the ions traveling straight in the z direction cause the channeling phenomenon, and the ions having angular components deviated to some extent from the z direction in the x direction are blocked by the crystal planes 99 and does not cause the channeling phenomenon. Meanwhile, the ion beam having an angular distribution in the y direction are not blocked by the crystal planes 99 and the channeling phenomenon occurs in the clearances between the crystal planes 99. Accordingly, the wafer disposed to satisfy the plane channeling condition mainly generates the "plane channeling" which occurs on the ions traveling along a reference plane defined by both the z direction which is along the incident direction of the ion beam B and the y direction. Therefore, when the wafer disposed to satisfy the plane channeling condition is irradiated with the ion beam, direction dependency is generated, in which the ions having the angular components in the x direction does not cause the phenomenon and the ions having the angular components in the y direction cause the channeling phenomenon.

The disposition which satisfies the plane channeling condition is not limited to the above-described settings of the twist angle and tilt angle. Other twist angles and tilt angles maybe used as long as the wafer is disposed such that the atomic arrangement shown in FIG. 20B can be realized. In order to realize the plane channeling condition, for example, the twist angle φ of the wafer W may be substantially 0° to 45°, and the tilt angle θ of the wafer W may be substantially in a range of substantially 15° to 60°.

FIG. 20C shows an atomic arrangement in a where the atoms are disposed to satisfy an off-channeling condition and shows a case where the wafer W is disposed in an orientation at the twist angle φ=23° and the tilt angle θ=7°. In the off-channeling condition, any channel which is a path for the traveling ions is not visible, and it appears that the silicon atoms are disposed without clearances in both the x direction and the y direction. As a result, when the wafer disposed so as to satisfy the off-channeling condition is irradiated with the ion beam, t the off-channeling state is realized in which the channeling phenomenon does not occur regardless of whether or not the ions constituting the ion beam have the angular components in the x direction or the y direction.

The disposition which satisfies the off-channeling condition is not limited to the above-described settings of the twist angle and tilt angle. Other twist angles and tilt angles maybe used as long as the wafer is disposed such that the atomic arrangement shown in FIG. 20C can be realized. More specifically, if the wafer W is disposed in such an orientation that low-order crystal planes such as the {100} plane, the {110} plane, and the {111} plane of the wafer intersect diagonally the reference trajectory of the ion beam, other angular conditions may be used. In order to realize the off-channeling condition, for example, the twist angle φ of the wafer W may be substantially in a range of 15° to 30°, and the tilt angle θ of the wafer W may be substantially in a range of 7° to 15°.

In the present embodiment, the axial channeling condition shown in FIG. 20A can be used as the disposition of the wafer "satisfying a predetermined channeling condition". In the disposition shown in FIG. 20A, the tilt angle θ is 0°, and thus, even in a case where a thick mask is formed on the wafer surface, the ion beam B is incident into the direction perpendicular to the wafer surface, and it is possible to accurately implant the ions into the location corresponding to the opening portion of the mask. In addition, as an implantation process for manufacturing a semiconductor device, only the implantation process using the axial channeling condition shown in FIG. 20A may be performed, or the implantation process using the plane channeling condition shown in FIG. 20B and/or the implantation process using the off-channeling condition shown in FIG. 20C may be additionally combined and performed.

Figure 21:
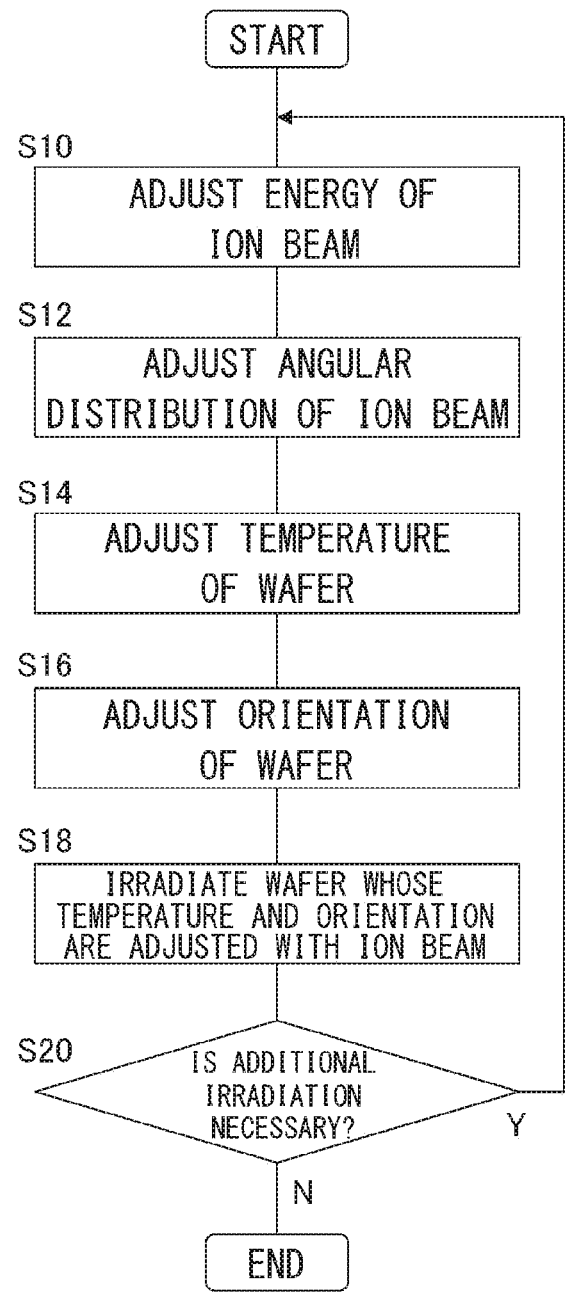
FIG. 21 is a flowchart showing a flow of an ion implantation method according to the embodiment.

FIG. 21 is a flowchart showing a flow of an ion implantation method according to the embodiment. First, the energy of the ion beam B with which the wafer W should be irradiated is adjusted (S10). For example, it is possible to adjust the energy of the ion beam B by controlling the operation of the high energy multistage linear acceleration unit 14. Subsequently, the angular distribution of the ion beam B with which the wafer W should be irradiated is adjusted (S12). For example, it is possible to adjust the angular distribution of the ion beam B by changing the potentials Qx and Qy of the lens devices 32*a* to 32*c* in the beam shaper 32. In this case, the angular characteristics of the beam may be adjusted such that the spread of the angular distribution is equal to or less than the critical angle θ for the channeling corresponding to the energy and the ion species of the ion beam B.

Next, the wafer W which is the implantation target is transferred into the ion implantation chamber 60 and is fixed on the wafer holding device 42, and the temperature of the wafer W is adjusted using the temperature adjustment device 50 (S14). In this case, it is possible to heat or cool the wafer W using the temperature adjustment device 50 such that the temperature of the wafer W reaches a desired temperature. In a case where the implantation process is performed in the room temperature, or in a case where the temperature of the wafer W is already adjusted to be the desired temperature, the wafer W may not be heated or cooled. Subsequently, the orientation of wafer W is adjusted using the twist angle adjustment mechanism 46 and the tilt angle adjustment mechanism 48 such that a desired channeling condition is satisfied (S16). The temperature adjustment process of S14 and the orientation adjustment process of S16 may be performed in reverse order, or may be performed in parallel.

Subsequently, the wafer W whose temperature and orientation are adjusted is irradiated with the ion beam B and the ion implantation process is performed (S18). The temperature adjustment of the wafer W may be performed in parallel while the ion implantation process of S18 is performed, and for example, the wafer W may be irradiated with the ion beam B while the wafer W is heated or cooled. In addition, the wafer W may be heated using power applied to the wafer W by the irradiation of the ion beam B. For example, in a case where the wafer W is implanted at a high temperature, the wafer W may be heated using the temperature adjustment device 50 before the beam irradiation and may be heated using the power of the beam during the beam irradiation. The heating by the temperature adjustment device 50 may be used in combination during the beam irradiation, or the cooling by the temperature adjustment device 50 may be used in combination in a case where the wafer W is excessively heated using the power of the beam. In addition, the temperature of the wafer W may be maintained constantly during the beam irradiation under the cooling by the temperature adjustment device 50, in order to suppress the heating by the power of the beam.

Subsequently, if an additional irradiation with the ion beam B is necessary (Y in S20), the processes in S10 to S18 are performed again. For example, as shown in FIGS. 11A to 11C and 12A to 12C, in the case where a plurality of implantation processes are performed by changing the energy of the ion beam B and/or the temperature T of the wafer W, the processes in S10 to S18 are performed by changing the implantation condition at each time. In this case, the changed implantation conditions may include the ion species, the energy, the dose, the angular distribution of the ion beam B, the tilt angle $\theta$, the twist angle $\varphi$, the temperature T of the wafer W, or the like. Meanwhile, if there is no need for the additional irradiation with the ion beam B (N in S20), the present flow ends.

In the plurality of implantation processes, the conditions of the wafer temperature T may be set to be approximately the room temperature (27° C., 300K). The temperature conditions may be set such that the wafer temperatures T are equal to or lower than the room temperature in all of the plurality of implantation processes, and for example, the temperature conditions may be changed in a range of −200° C. to 27° C. As a specific example, temperatures of about −196° C. (77K), −123° C. (150K), −73° C. (200K), −23° C. (250K), and 27° C. (300K) may be set. Meanwhile, the temperature conditions may be set such that wafer temperatures T are equal to or higher than room temperature in all of the plurality of times of implantation processing, and, for example, the temperature conditions may be changed in the range of 27° C. to 500° C. As a specific example, temperatures of about 27° C. (300K), 127° C. (400K), 227° C. (500K), 327° C. (600K), 427° C. (700K), 500° C. (773K) maybe set. In addition, temperatures both below the room temperature and above the room temperature maybe included, and the temperature conditions may be changed in a range of −200° C. to 500° C.

In the plurality of implantation process, the implantation profile may be controlled by not only adjusting the wafer temperature T but also the angular distribution of the ion beam B, and at least one of an average value (average angle) and a standard deviation value (divergent/convergent angle) of the angular distribution of the ion beam B may be finely adjusted. For example, in the plurality of implantation process, the average value of the angular distribution of the ion beam B with respect to the crystal axis C of the wafer W may be changed by 0.1° or more within a range less than the critical angle $\theta$ or more than the critical angle $\theta_c$, and as a specific example, the average value may be set to be 0.1°, 0.3°, 0.5°, 0.8°, 1°, 1.5°, 2°, 2.5°, 3°, 3.5°, 5°, 7°, or the like. The average value of the angular distribution with respect to the wafer W can be adjusted by the tilt angle adjustment mechanism 48. The standard deviation value of the angular distribution of the ion beam B may be adjusted in 0.1° steps. The standard deviation value of the angular distribution of the ion beam B can be adjusted by the beam shaper 32.

Moreover, in a case where the plurality of implantation processes are performed with changing the energy of the ion beam B and the temperature T of the wafer W, the plurality of implantation process may not be continuously performed on one wafer W. For example, in a case where the plurality of implantation process using the same conditions are performed on a plurality of wafers W for mass production, a first implantation process using a first condition maybe continuously performed on the plurality of wafers, and thereafter, the setting of the ion implanter 100 may be changed from the first condition to a second condition, and a second implantation process using the second condition may be continuously performed on the plurality of wafers.

In addition, the process of adjusting the temperature of the wafer W may be performed in the middle of the transfer process of the wafer W. For example, as explained with FIG. 17, it is necessary to move the wafer W' loaded into the ion implantation chamber 60 from the loading/unloading position to the implantation position by operation of the platen driving unit 40. It is also necessary to adjust the tilt angle $\theta$ and the twist angle $\varphi$ for the wafer W disposed at the implantation position. By heating or cooling the wafer W to a desired temperature during the performance of such a preparation process in the ion implantation chamber 60, an additional operation time required for the temperature adjustment can be reduced, and thus, it is possible to prevent throughput of the ion implantation process from decreasing.

In addition, the process of adjusting the temperature of the wafer W may be performed in the preliminary chamber different from the ion implantation chamber 60. For example, the substrate transfer unit 62 may be provided with the preliminary chamber to control the temperature of the wafer W, and the wafer W may be heated or cooled using a temperature adjustment device installed in the preliminary chamber. The substrate transfer robot 58 or the like may be provided with the temperature adjustment device, and the substrate transfer robot 58 may be capable of heating or cooling the wafer W during the transfer of the wafer W. The wafer W may be heated or cooled only at a place different from the ion implantation chamber 60, or the temperature control of the wafer W at the place different from the ion implantation chamber 60 and the temperature control in the ion implantation chamber 60 may be combined with each other. Moreover, instead of actively cooling the wafer W using the temperature adjustment device 50, the temperature of the wafer W may be adjusted by cooling the wafer W using heat dissipation from the wafer W due to the temperature difference between the wafer and a surrounding environment of the wafer.

It should be understood that the invention is not limited to the above-described embodiment, but may be modified into various forms on the basis of the spirit of the invention. Additionally, the modifications are included in the scope of the invention.

In the above-described embodiment, the case where the isolation implantation or the photodiode implantation is performed by irradiating the wafer W with the ion beam B from above the mask 80 having a large thickness t is described as an example. The present embodiment is not limited to the application described above, and, for example, the present embodiment may be applied to a formation of a trench-type pn junction structure used in a power device or the like, a formation of a trench-type pn junction structure or a planar-type pn junction structure used in a logic circuit or the like, or the like. In this case, the ion implantation maybe performed using an electrode layer, an insulating layer, or the like provided on the wafer surface as the mask.

In the above-described embodiment, the control of the implantation profile of the implanted ions is described. The present embodiment can be similarly applied to a control of profile of implantation damage (crystal defect) in the wafer caused by the ion implantation.

What is claimed is:

1. An ion implantation method comprising:
    setting, by a temperature adjustment device, a temperature of a wafer to a first temperature;
    irradiating, by an ion implanter when the wafer is at the first temperature, a first ion beam onto a predetermined position on the wafer with an orientation at an implantation angle condition so as to form a first implantation profile in the wafer;
    setting, by the temperature adjustment device after the ion implanter irradiates the first ion beam onto the wafer, the temperature of the wafer to a second temperature that differs from the first temperature; and
    irradiating, by the ion implanter when the wafer is at the second temperature, a second ion beam onto the predetermined position on the wafer with the orientation at the implantation angle condition so as to form a second implantation profile in the wafer,
    wherein the first ion beam is adjusted by a beam shaper of the ion implanter such that the first ion beam has a first angle distribution,
    wherein the second ion beam is adjusted by the beam shaper such that the second ion beam has a second angle distribution, and
    wherein the first angle distribution and the second angle distribution satisfy a condition that at least a full width at half maximum component of an
    angle distribution of an ion beam irradiated to the wafer is on-channeling, when the ion beam is irradiated onto the wafer at the predetermined position on the wafer surface in an incident direction under the implantation angle condition.

2. The ion implantation method according to claim 1, wherein the first implantation profile is deeper in the wafer than the second implantation profile.

3. The ion implantation method according to claim 1, wherein a width of the first implantation profile in an in-plane direction is different from a width of the second implantation profile in the in-plane direction.

4. The ion implantation method according to claim 3, wherein a width of the first implantation profile in the in-plane direction is smaller than a width of the second implantation profile in the in-plane direction.

5. The ion implantation method according to claim 3, wherein a width of the first implantation profile in the in-plane direction is larger than a width of the second implantation profile in the in-plane direction.

6. The ion implantation method according to claim 1, wherein the second temperature is higher than the first temperature.

7. The ion implantation method according to claim 1, wherein the second temperature is lower than the first temperature.

8. The ion implantation method according to claim 1, wherein the first temperature and the second temperature are respectively between −200° C. and 500° C.

9. The ion implantation method according to claim 1, wherein a difference between the first temperature and the second temperature is 100° C. or more.

10. The ion implantation method according to claim 1, wherein an energy of the second ion beam is lower than an energy of the first ion beam.

11. The ion implantation method according to claim 1, wherein an ion species of the first ion beam is a same species as an ion species of the second ion beam.

12. The ion implantation method according to claim 1, wherein an energy of the first ion beam is different from an energy of the second ion beam.

13. The ion implantation method according to claim 1, wherein the first ion beam and the second ion beam are respectively at a dose of $1\times10^{14}$ cm$^{-2}$ or less, or $1\times10^{13}$ cm$^{-2}$ or less.

14. The ion implantation method according to claim 1, wherein a divergent beam is from the group consisting of the first ion beam and the second ion beam.

15. The ion implantation method according to claim 1, wherein a convergent beam is from the group consisting of the first ion beam and the second ion beam.

16. The ion implantation method according to claim 1, further comprising:
    separating, during an irradiation of a beam from the group consisting of the first ion beam and the second ion beam, the temperature adjustment device from a wafer holding device.

17. The ion implantation method according to claim 1, further comprising:
    irradiating, by the ion implanter when the wafer is at a third temperature, a third ion beam onto the wafer at the implantation angle condition so as to form a third implantation profile in the wafer.

18. The ion implantation method according to claim 17, wherein the third temperature differs from the first temperature.

19. The ion implantation method according to claim 17, wherein the second temperature differs from the third temperature.

20. The ion implantation method according to claim 17, further comprising:
    setting, by the temperature adjustment device after the ion implanter irradiates the second ion beam onto the wafer, the temperature of the wafer to the third temperature.

21. The ion implantation method according to claim 1, wherein the temperature adjustment device comprises:
    a first temperature adjustment device that adjusts the temperature of the wafer to the first temperature, and
    a second temperature adjustment device that adjusts the temperature of the wafer to the second temperature.

22. The ion implantation method according to claim 1, wherein the first angle distribution is adjusted by focusing or diverging the first ion beam in a first direction perpendicular to a direction of incidence of the ion beam to the wafer surface, and by focusing or diverging the first ion beam in a second direction perpendicular to both the direction of incidence of the ion beam and the first direction, and wherein the second angle distribution is adjusted by focusing or diverging the second ion beam in a first direction and by focusing or diverging the second ion beam in the second direction.

23. The ion implantation method according to claim 1, wherein the absolute value of the incident angle in the ion beam for on-channeling is smaller than critical angle $\theta_C$ shown by the following expression (1)

$$\theta_C = \sqrt{Z_1 Z_2 e^2 / 2\pi \varepsilon_0 E_1 d} \tag{1}$$

where Z1 is an atomic number of the implanted ion, Z2 is an atomic number of a material which is an implantation target, E1 is energy of the implanted ion, and d is an atomic interval in a crystal of the material which is the implantation target.

\* \* \* \* \*